(12) United States Patent
Maki

(10) Patent No.: US 8,987,917 B2
(45) Date of Patent: Mar. 24, 2015

(54) SEMICONDUCTOR DEVICE HAVING NON-PLANAR INTERFACE BETWEEN A PLUG LAYER AND A CONTACT LAYER

(71) Applicant: Renesas Electronics Corporation, Nakahara-ku, Kawasaki-shi, Kanagawa (JP)

(72) Inventor: Yukio Maki, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/772,089

(22) Filed: Feb. 20, 2013

(65) Prior Publication Data
US 2013/0214428 A1    Aug. 22, 2013

(30) Foreign Application Priority Data
Feb. 22, 2012   (JP) .................. 2012-036511

(51) Int. Cl.
| H01L 23/12 | (2006.01) |
| H01L 23/48 | (2006.01) |
| H01L 29/40 | (2006.01) |
| H01L 23/52 | (2006.01) |
| H01L 23/522 | (2006.01) |
| H01L 21/768 | (2006.01) |
| H01L 23/528 | (2006.01) |
| H01L 27/105 | (2006.01) |
| H01L 27/11 | (2006.01) |
| H01L 49/02 | (2006.01) |

(52) U.S. Cl.
CPC ...... *H01L 23/5226* (2013.01); *H01L 21/76877* (2013.01); *H01L 23/5283* (2013.01); *H01L 27/105* (2013.01); *H01L 27/1108* (2013.01); *H01L 27/1116* (2013.01); *H01L 28/90* (2013.01); *H01L 2924/0002* (2013.01)
USPC ........... 257/774; 257/758; 257/412; 438/637; 438/195; 438/701

(58) Field of Classification Search
CPC .................. H01L 23/53238; H01L 21/76885; H01L 23/5226; H01L 21/76802; H01L 21/76877; H01L 21/76832
USPC .......... 257/773, 774, 776, E23.011, E23.145, 257/E23.151
See application file for complete search history.

(56) References Cited

U.S. PATENT DOCUMENTS

| 5,451,543 | A | * | 9/1995 | Woo et al. ...................... 438/637 |
| 6,020,258 | A | * | 2/2000 | Yew et al. ..................... 438/634 |
| 6,734,561 | B2 | * | 5/2004 | Kawai ............................ 257/758 |
| 6,750,140 | B2 | * | 6/2004 | Hohnsdorf .................... 438/637 |
| 6,762,497 | B2 | * | 7/2004 | Gayet et al. ................... 257/758 |

(Continued)

FOREIGN PATENT DOCUMENTS

JP    2003-332464 A    11/2003

*Primary Examiner* — Matthew Reames
*Assistant Examiner* — Vincent Wall
(74) *Attorney, Agent, or Firm* — Womble Carlyle

(57) ABSTRACT

A semiconductor device is provided, in which it becomes easy to reliably couple a plug conductive layer and a wiring layer located over the plug conductive layer to each other and falling of the wiring can be suppressed. The plug conductive layer contacts a source/drain region formed over a major surface of the semiconductor substrate. A contact conductive layer is formed so as to contact both the upper surface and the side surface of the plug conductive layer. Wiring layers are formed over the contact conductive layer so as to be electrically coupled to the contact conductive layer.

18 Claims, 38 Drawing Sheets

(56) References Cited

U.S. PATENT DOCUMENTS

| | | |
|---|---|---|
| 6,853,022 B2 | 2/2005 | Koga et al. |
| 6,958,547 B2 * | 10/2005 | Dubin et al. ............. 257/774 |
| 2001/0014528 A1 * | 8/2001 | Tsai ............................ 438/637 |

* cited by examiner

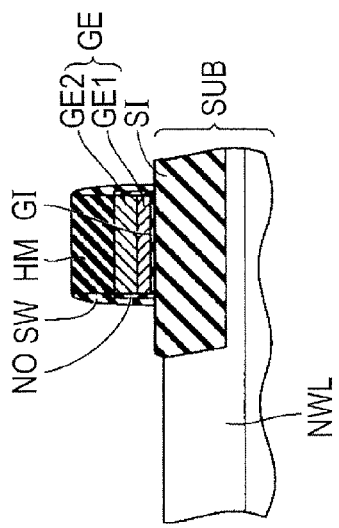
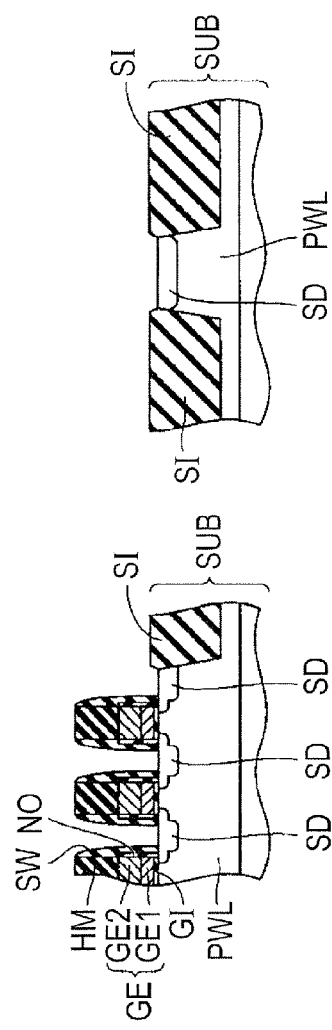

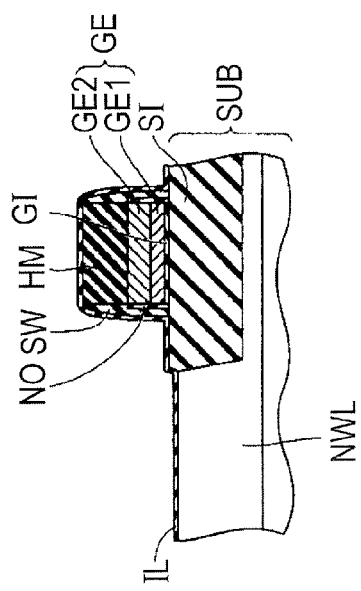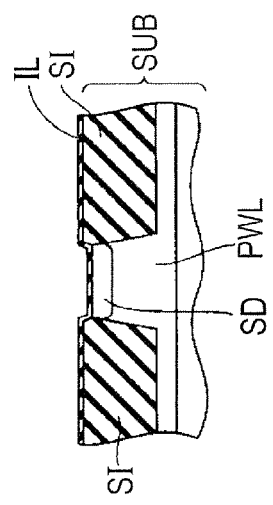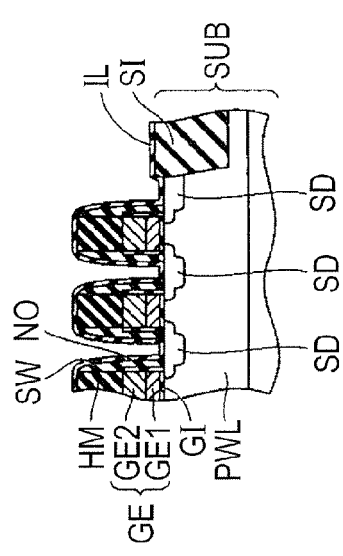

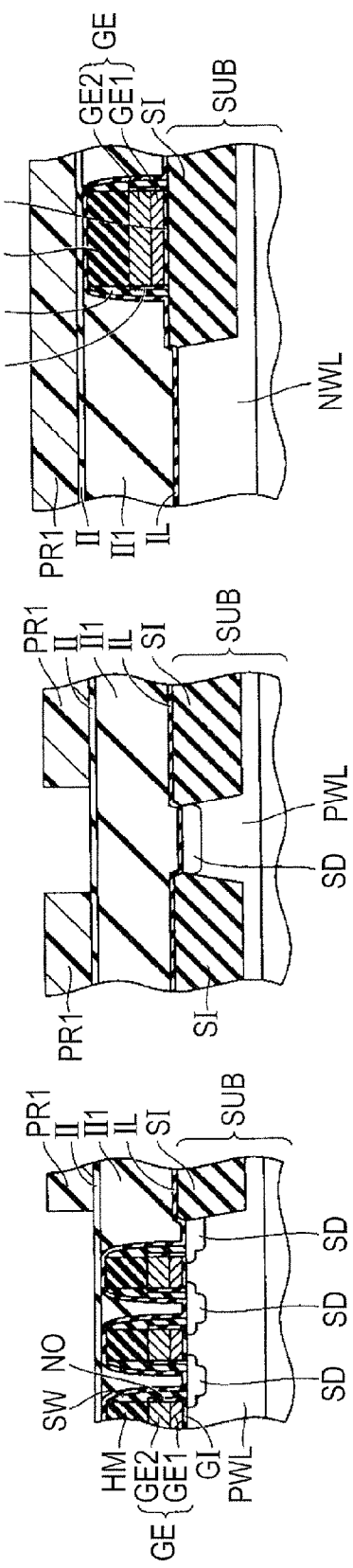

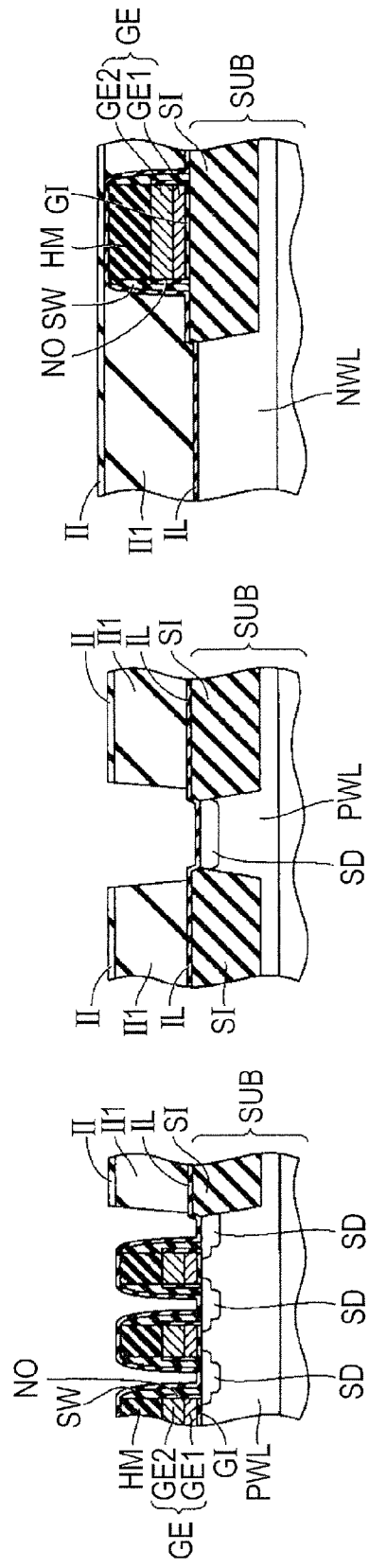

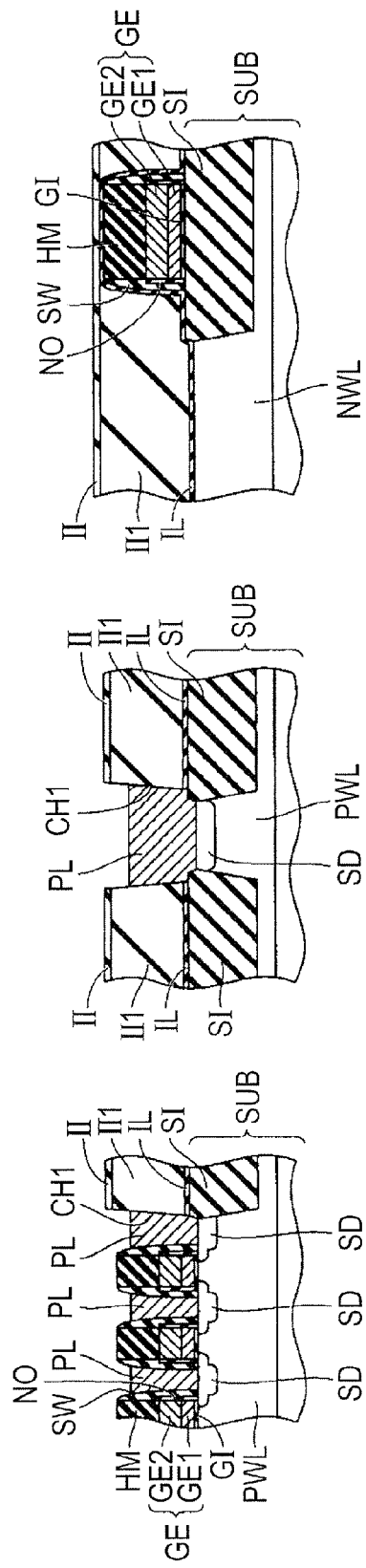

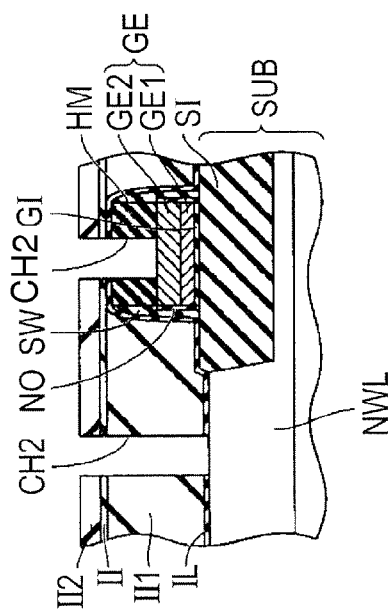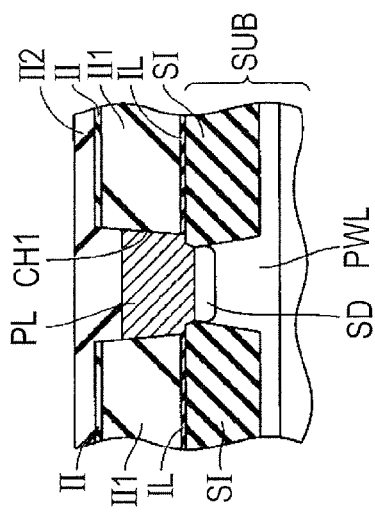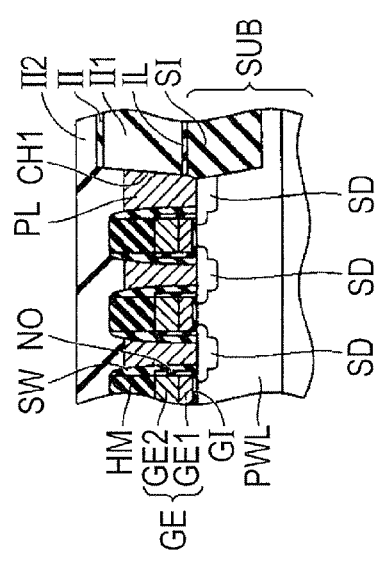

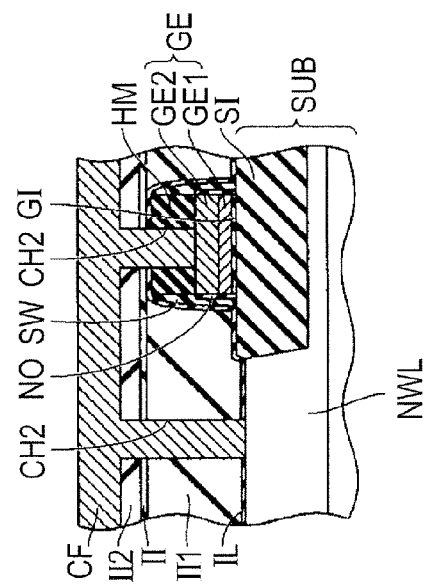
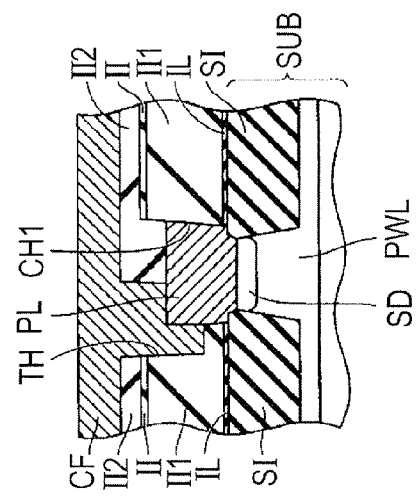
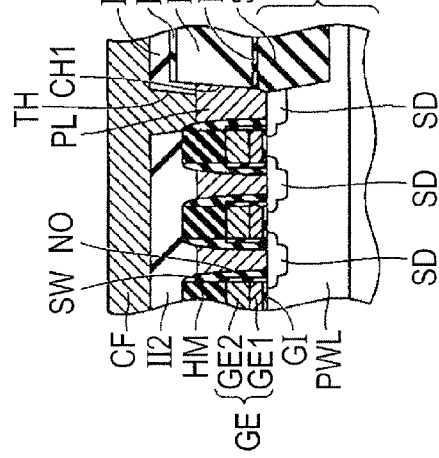

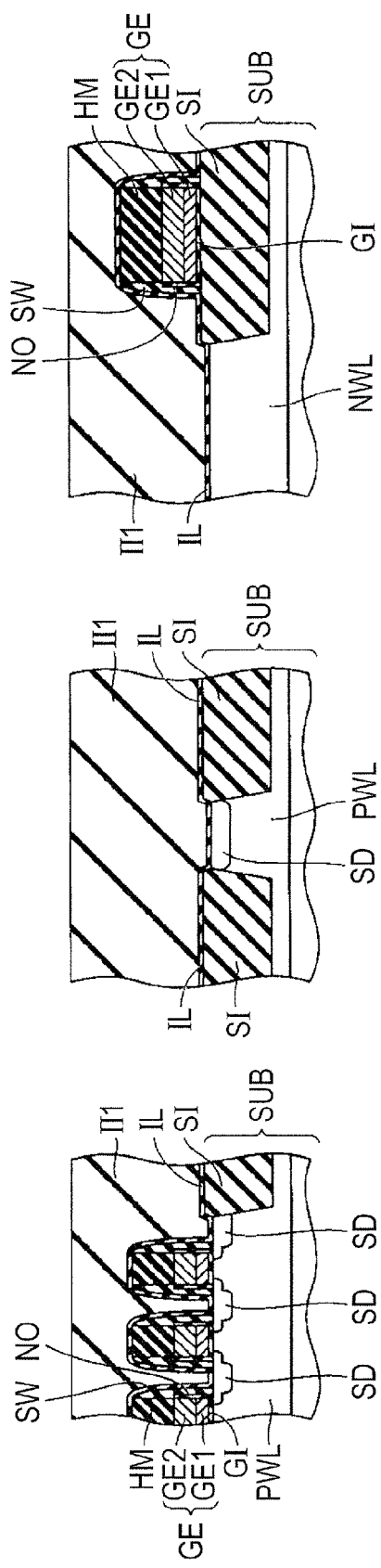

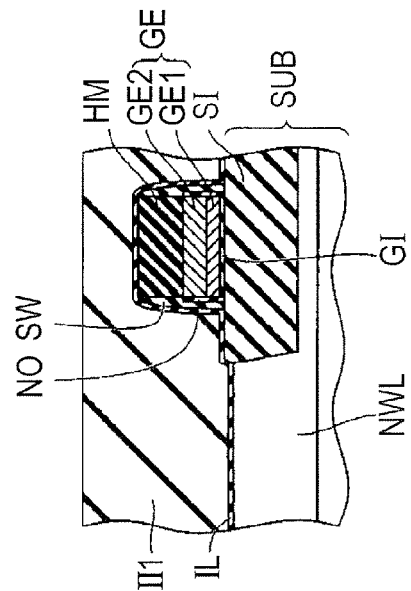
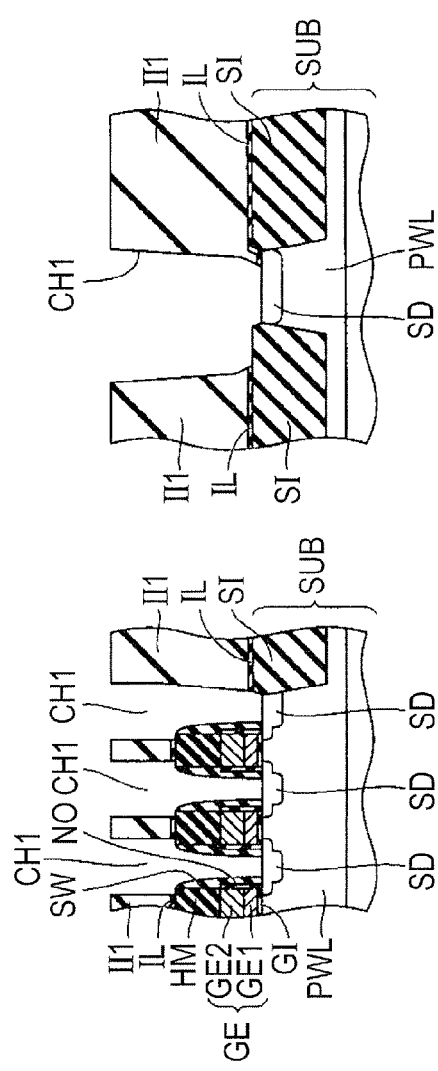

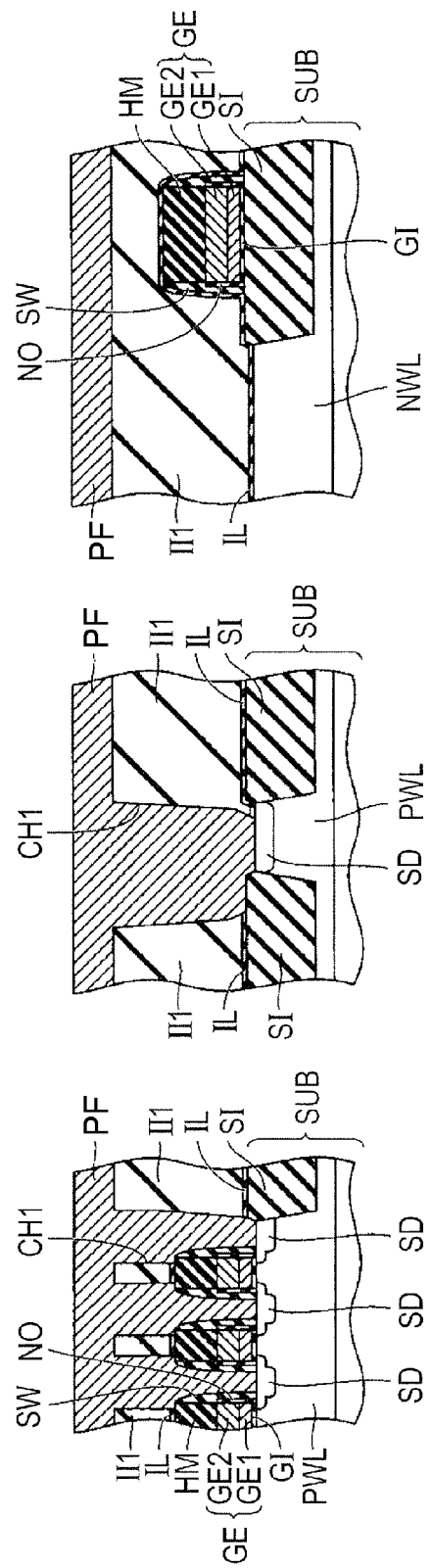

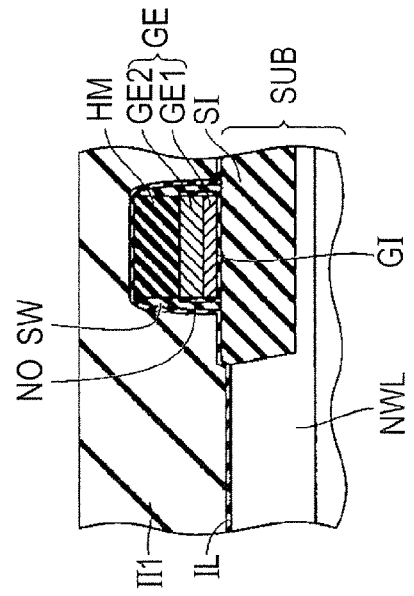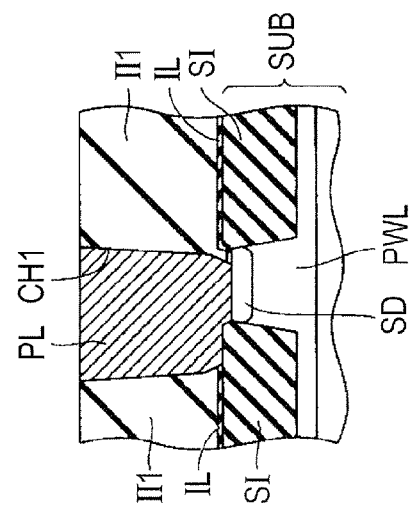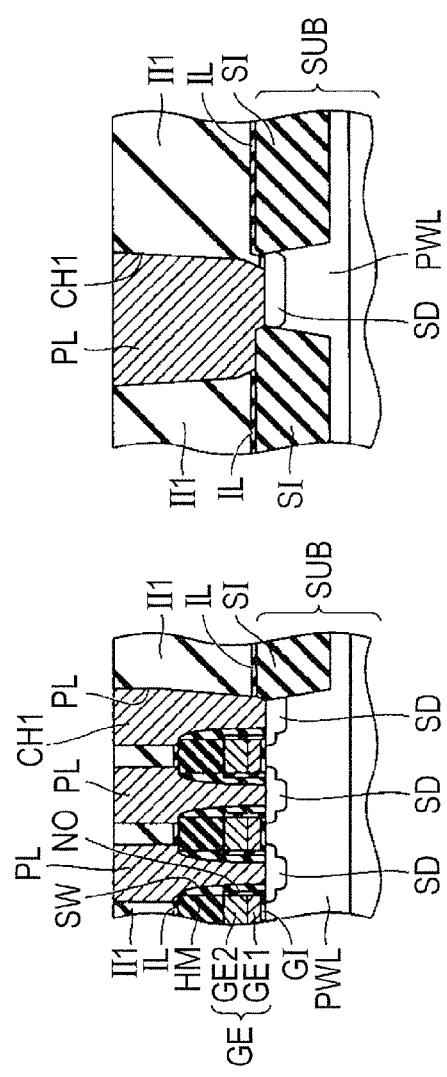

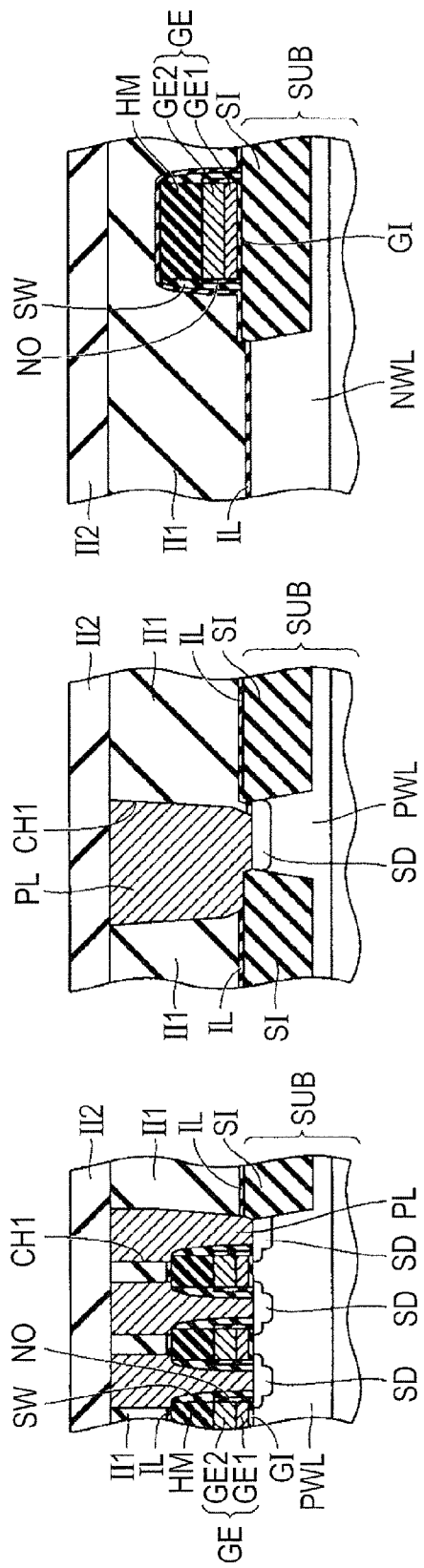

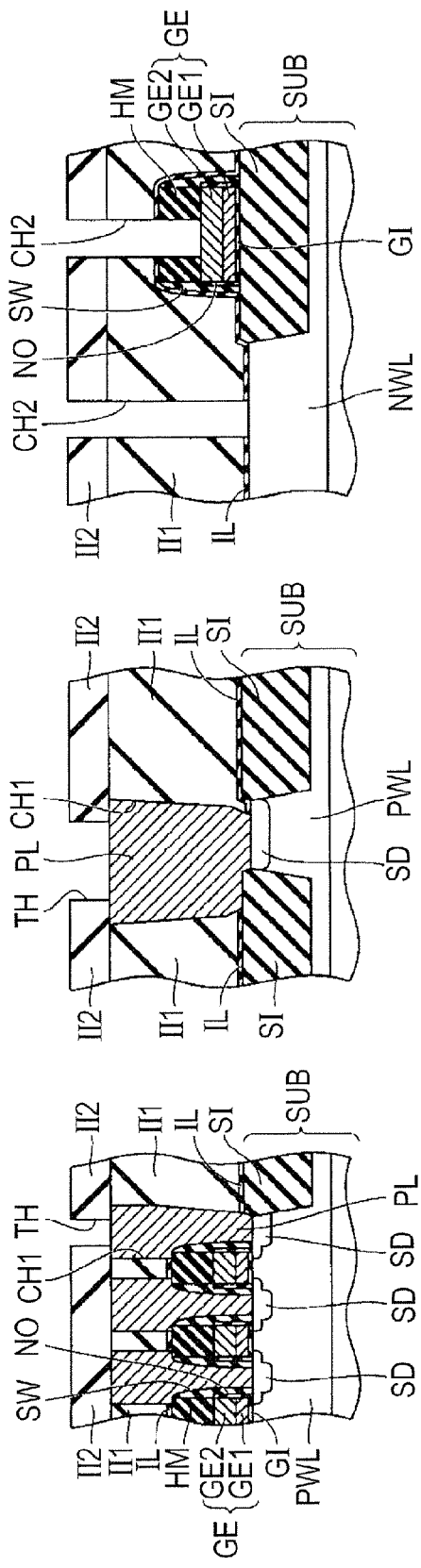

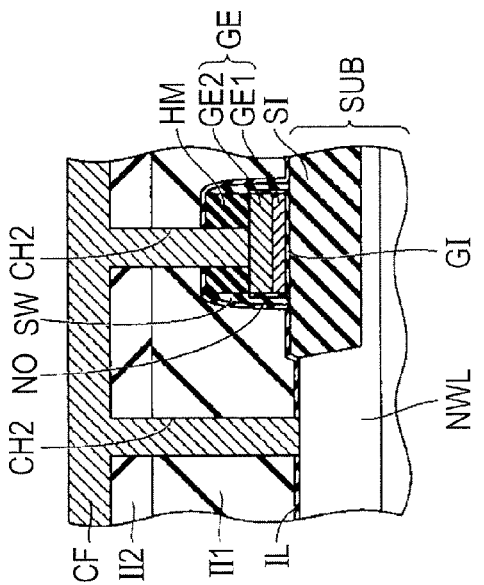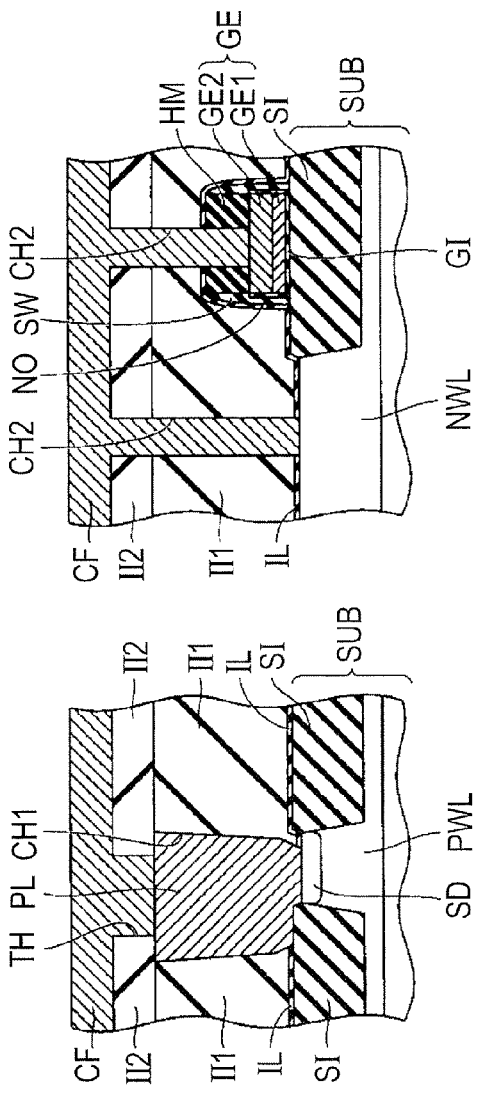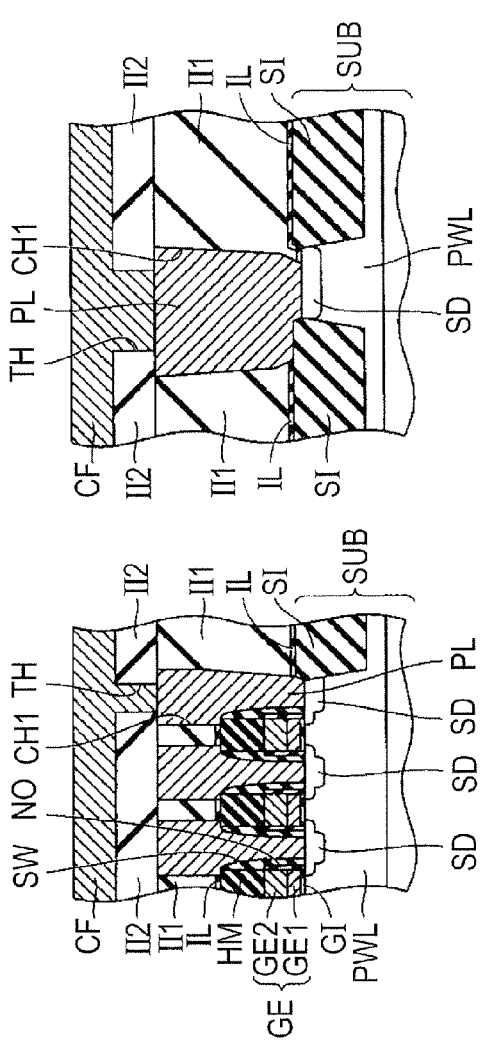

SEMICONDUCTOR DEVICE HAVING NON-PLANAR INTERFACE BETWEEN A PLUG LAYER AND A CONTACT LAYER

CROSS-REFERENCE TO RELATED APPLICATIONS

The disclosure of Japanese Patent Application No. 2012-036511 filed on Feb. 22, 2012 including the specification, drawings and abstract is incorporated herein by reference in its entirety.

BACKGROUND

The present invention relates to a semiconductor device.

With the high integration and miniaturization of semiconductor devices, there is an increasing trend in which a plurality of fine elements, which form a semiconductor device, are multi-layered so as to overlap each other, when viewed from above. With the multi-layering of the semiconductor devices, a technique for electrically coupling, by a coupling layer referred to as a plug, a source/drain region of a transistor formed over the major surface of a semiconductor substrate to a layer located over the transistor is frequently used. Structures, in each of which a source/drain region of a transistor and a layer arranged over the transistor are electrically coupled to each other by a plug conductive layer, are disclosed in, for example, Japanese Unexamined Patent Publication No. 2004-79696 and Japanese Unexamined Patent Publication No. 2003-332464, etc.

The semiconductor device disclosed in Japanese Unexamined Patent Publication No. 2004-79696 is a volatile memory referred to as an SRAM (Static Random Access Memory). In the SRAM disclosed therein, a capacitor as a so-called DRAM (Dynamic Random Access Memory) is added to an SRAM circuit in which a thin film transistor, referred to as a so-called TFT (Thin Film Transistor), is used as a load transistor. A charge is held in the capacitor, instead of a memory node, and an electric potential in the capacitor is held by a so-called flip-flop circuit that forms the SRAM circuit. Accordingly, occurrence of a soft error, due to an alpha ray (α ray), can be suppressed in comparison with an SRAM in which a charge is accumulated in a memory node. Further, at least part of the flip-flop circuit is provided over a bit-line, and hence the semiconductor device can be made small (miniaturized).

In Japanese Unexamined Patent Publication No. 2003-332464, an eave-shaped lead-out portion that only contacts the side of a contact electrode is formed.

SUMMARY

In the structures described in the aforementioned two Publications, however, when a line width becomes small with the miniaturization of the device, it becomes difficult to reliably couple the plug conductive layer and a wiring layer located over the plug conductive layer to each other. In addition, a relative wiring height with respect to the line width becomes larger as the line width becomes smaller, and hence the wiring is more likely to fall.

Other problems and new features will become apparent from the description and the accompanying drawings of the present specification.

In a semiconductor device according to an embodiment, a plug conductive layer is in contact with a conductive region formed over a major surface of a semiconductor substrate. A contact conductive layer is formed so as to contact both the upper surface and the side surface of the plug conductive layer, thereby forming a non-planar interface. A wiring layer is formed over the contact conductive layer so as to be electrically coupled to the contact conductive layer.

BRIEF DESCRIPTION OF THE DRAWINGS

FIGS. 9A to 9C are views illustrating a first step of a method of manufacturing the semiconductor device according to First Embodiment, in which: FIG. 9A is a schematic sectional view corresponding to FIG. 7; FIG. 9B is a schematic sectional view corresponding to FIG. 8; and FIG. 9C is a schematic sectional view of a peripheral circuit;

FIGS. 10A to 10C are views illustrating a second step of the method of manufacturing the semiconductor device according to First Embodiment, in which: FIG. 10A is a schematic sectional view corresponding to FIG. 7; FIG. 10B is a schematic sectional view corresponding to FIG. 8; and FIG. 10C is a schematic sectional view of the peripheral circuit;

FIGS. 11A to 11C are views illustrating a third step of the method of manufacturing the semiconductor device according to First Embodiment, in which: FIG. 11A is a schematic sectional view corresponding to FIG. 7; FIG. 11B is a schematic sectional view corresponding to FIG. 8; and FIG. 11C is a schematic sectional view of the peripheral circuit;

FIGS. 12A to 12C are views illustrating a fourth step of the method of manufacturing the semiconductor device according to First Embodiment, in which: FIG. 12A is a schematic sectional view corresponding to FIG. 7; FIG. 12B is a schematic sectional view corresponding to FIG. 8; and FIG. 12C is a schematic sectional view of the peripheral circuit;

FIGS. 13A to 13C are views illustrating a fifth step of the method of manufacturing the semiconductor device according to First Embodiment, in which: FIG. 13A is a schematic sectional view corresponding to FIG. 7; FIG. 13B is a schematic sectional view corresponding to FIG. 8; and FIG. 13C is a schematic sectional view of the peripheral circuit;

FIGS. 14A to 14C are views illustrating a sixth step of the method of manufacturing the semiconductor device according to First Embodiment, in which: FIG. 14A is a schematic sectional view corresponding to FIG. 7; FIG. 14B is a schematic sectional view corresponding to FIG. 8; and FIG. 14C is a schematic sectional view of the peripheral circuit;

FIGS. 15A to 15C are views illustrating a seventh step of the method of manufacturing the semiconductor device according to First Embodiment, in which: FIG. 15A is a schematic sectional view corresponding to FIG. 7; FIG. 15B is a schematic sectional view corresponding to FIG. 8; and FIG. 15C is a schematic sectional view of the peripheral circuit;

FIGS. 16A to 16C are views illustrating an eighth step of the method of manufacturing the semiconductor device according to First Embodiment, in which: FIG. 16A is a schematic sectional view corresponding to FIG. 7; FIG. 16B is a schematic sectional view corresponding to FIG. 8; and FIG. 16C is a schematic sectional view of the peripheral circuit;

FIGS. 17A to 17C are views illustrating a ninth step of the method of manufacturing the semiconductor device according to First Embodiment, in which: FIG. 17A is a schematic sectional view corresponding to FIG. 7; FIG. 17B is a schematic sectional view corresponding to FIG. 8; and FIG. 17C is a schematic sectional view of the peripheral circuit;

FIGS. 18A to 18C are views illustrating a tenth step of the method of manufacturing the semiconductor device according to First Embodiment, in which: FIG. 18A is a schematic is sectional view corresponding to FIG. 7; FIG. 18B is a schematic sectional view corresponding to FIG. 8; and FIG. 18C is a schematic sectional view of the peripheral circuit;

FIGS. 19A to 19C are views illustrating an eleventh step of the method of manufacturing the semiconductor device according to First Embodiment, in which: FIG. 19A is a schematic sectional view corresponding to FIG. 7; FIG. 19B is a schematic sectional view corresponding to FIG. 8; and FIG. 19C is a schematic sectional view of the peripheral circuit;

FIGS. 20A to 20C are views illustrating a twelfth step of the method of manufacturing the semiconductor device according to First Embodiment, in which: FIG. 20A is a schematic sectional view corresponding to FIG. 7; FIG. 20B is a schematic sectional view corresponding to FIG. 8; and FIG. 20C is a schematic sectional view of the peripheral circuit;

FIGS. 21A to 21C are views illustrating a thirteenth step of the method of manufacturing the semiconductor device according to First Embodiment, in which: FIG. 21A is a schematic sectional view corresponding to FIG. 7; FIG. 21B is a schematic sectional view corresponding to FIG. 8; and FIG. 21C is a schematic sectional view of the peripheral circuit;

FIGS. 22A to 22C are views illustrating a fourteenth step of the method of manufacturing the semiconductor device according to First Embodiment, in which: FIG. 22A is a schematic sectional view corresponding to FIG. 7; FIG. 22B is a schematic sectional view corresponding to FIG. 8; and FIG. 22C is a schematic sectional view of the peripheral circuit;

FIGS. 27A to 27C are views illustrating a first step of a method of manufacturing the semiconductor device according to the related art, in which: FIG. 27A is a schematic sectional view corresponding to FIG. 25; FIG. 27B is a schematic sectional view corresponding to FIG. 26; and FIG. 27C is a schematic sectional view of a peripheral circuit;

FIGS. 28A to 28C are views illustrating a second step of the method of manufacturing the semiconductor device according to the related art, in which: FIG. 28A is a schematic sectional view corresponding to FIG. 25; FIG. 28B is a schematic sectional view corresponding to FIG. 26; and FIG. 28C is a schematic sectional view of the peripheral circuit;

FIGS. 29A to 29C are views illustrating a third step of the method of manufacturing the semiconductor device according to the related art, in which: FIG. 29A is a schematic sectional view corresponding to FIG. 25; FIG. 29B is a schematic sectional view corresponding to FIG. 26; and FIG. 29C is a schematic sectional view of the peripheral circuit;

FIGS. 30A to 30C are views illustrating a fourth step of the method of manufacturing the semiconductor device according to the related art, in which: FIG. 30A is a schematic sectional view corresponding to FIG. 25; FIG. 30B is a schematic sectional view corresponding to FIG. 26; and FIG. 30C is a schematic sectional view of the peripheral circuit;

FIGS. 31A to 31C are views illustrating a fifth step of the method of manufacturing the semiconductor device according to the related art, in which: FIG. 31A is a schematic sectional view corresponding to FIG. 25; FIG. 31B is a schematic sectional view corresponding to FIG. 26; and FIG. 31C is a schematic sectional view of the peripheral circuit;

FIGS. 32A to 32C are views illustrating a sixth step of the method of manufacturing the semiconductor device according to the related art, in which: FIG. 32A is a schematic sectional view corresponding to FIG. 25; FIG. 32B is a schematic sectional view corresponding to FIG. 26; and FIG. 32C is a schematic sectional view of the peripheral circuit;

FIGS. 33A to 33C are views illustrating a seventh step of the method of manufacturing the semiconductor device according to the related art, in which: FIG. 33A is a schematic sectional view corresponding to FIG. 25; FIG. 33B is a schematic sectional view corresponding to FIG. 26; and FIG. 33C is a schematic sectional view of the peripheral circuit;

FIGS. 34A to 34C are views illustrating an eighth step of the method of manufacturing the semiconductor device according to the related art, in which: FIG. 34A is a schematic sectional view corresponding to FIG. 25; FIG. 34B is a schematic sectional view corresponding to FIG. 26; and FIG. 34C is a schematic sectional view of the peripheral circuit;

FIGS. 36A and 36B are views illustrating a first step of a method of manufacturing the semiconductor device according to Second Embodiment, in which: FIG. 36A is a schematic sectional view corresponding to the section in FIG. 7; and FIG. 36B is a schematic sectional view corresponding to FIG. 35;

FIGS. 37A and 37B are views illustrating a second step of the method of manufacturing the semiconductor device according to Second Embodiment, in which: FIG. 37A is a schematic sectional view corresponding to the section in FIG. 7; and FIG. 37B is a schematic sectional view corresponding to FIG. 35;

FIGS. 38A and 38B are views illustrating a third step of the method of manufacturing the semiconductor device according to Second Embodiment, in which: FIG. 38A is a schematic sectional view corresponding to the section in FIG. 7; and FIG. 38B is a schematic sectional view corresponding to FIG. 35;

DETAILED DESCRIPTION

Hereinafter, preferred embodiments will be described based on the accompanying drawings.
(First Embodiment)

Figure 1:
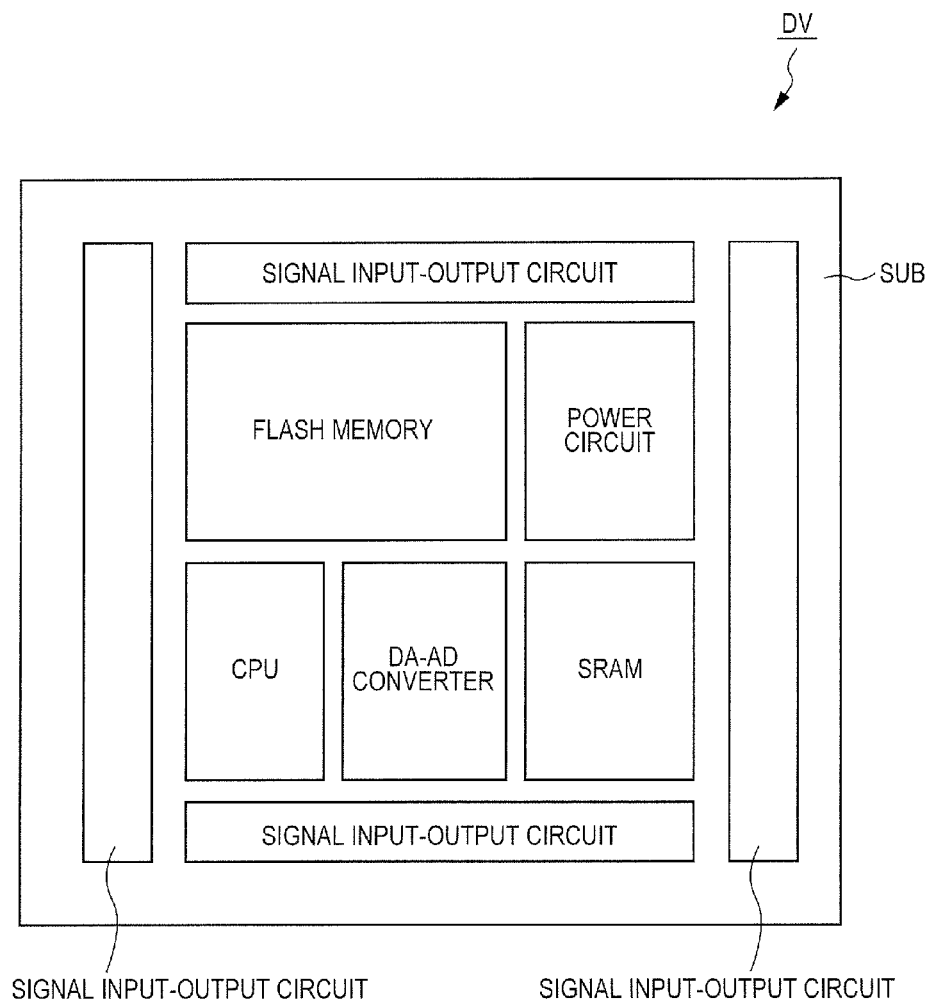
FIG. 1 is a schematic plan view illustrating a structure of a semiconductor device according to First Embodiment.

With reference to FIG. 1, in a semiconductor device DV according to the present embodiment, multiple types of circuits are formed over a major surface of a semiconductor substrate SUB, such as a semiconductor wafer comprised of, for example, silicon single crystals. As one example, a signal input-output circuit, DA (Digital/Analog)-AD converter, power circuit, CPU (Central Processing Unit), Flash memory, and SRAM (Static Random Access Memory) are exemplified as circuits that form the semiconductor device DV.

The role of each circuit that forms the semiconductor device DV is as follows. At first, in the signal input-output circuit, input and output of electrical signals to or from a circuit arranged outside the semiconductor device DV, etc., are performed. In the DA-AD converter, conversion between an analog signal and a digital signal is performed. In the power circuit, supply of the power, necessary for the drive of the semiconductor device DV, and control of the power are performed. In the CPU, a logical operation is performed by a logic circuit. In the Flash memory and the SRAM, data are stored.

Subsequently, a circuit structure of an SRAM memory cell to be used in the semiconductor device according to the present embodiment will be described with reference to FIG. 2.

Figure 2:
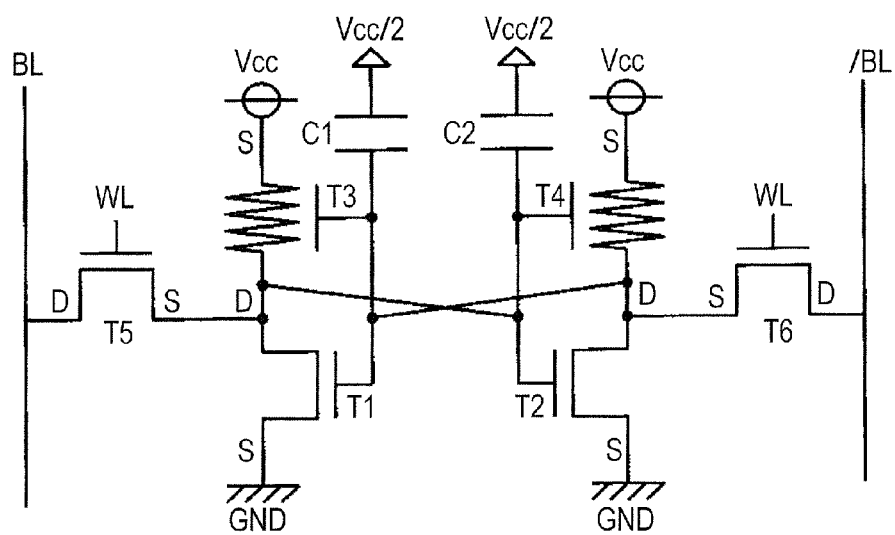
FIG. 2 is an equivalent circuit view of a memory cell that forms the semiconductor device according to First Embodiment.

With reference to FIG. 2, the SRAM memory cell has, for example, a pair of bit-lines BL and /BL, where /BL is the complement of BL, a word line WL, a flip-flop circuit, a pair of access transistors T5 and T6, and a pair of capacitors C1 and C2.

The flip-flop circuit has two CMOS (Complementary Metal Oxide Semiconductor) inverters. One of the CMOS inverters is formed by a driver transistor T1 and a load transistor T3. The other CMOS transistor is formed by a driver transistor T2 and a load transistor T4.

The SRAM is a semiconductor memory device in which the processing that is referred to so-called refresh, in which an electric charge accumulated as information is returned, at a predetermined period, to its original position by having a flip-flop circuit, is not needed. The SRAM in the present embodiment further has the capacitors C1 and C2 each equivalent to a DRAM.

In the flip-flop circuit, both the gate electrode of each of the driver transistor T1 and the load transistor T3 and one of the electrodes of the capacitor C1 are electrically coupled to the source S of the access transistor T6. The source S of the access transistor T6 is electrically coupled to the drain D of each of the driver transistor T2 and the load transistor T4, and a region where these are coupled functions as a first memory node unit.

Both the gate electrode of each of the driver transistor T2 and the load transistor T4 and one of the electrodes of the capacitor C2 are electrically coupled to the source S of the access transistor T5. The source S of the access transistor T5 is electrically coupled to the drain D of each of the driver transistor T1 and the load transistor T3, and a region where these are coupled functions as a second memory node unit.

The source S of each of the driver transistors T1 and T2 is electrically coupled to a GND electric potential, and the source S of each of the load transistors T3 and T4 is electrically coupled to a Vcc wiring (power supply wiring) through which a voltage Vcc is applied. Further, the other electrode of each of the capacitors C1 and C2 is electrically coupled to a Vcc/2 wiring through which a voltage Vcc/2 whose magnitude is half that of the Voltage Vcc is applied. Each of the pair of bit-lines BL and /BL is coupled to the drain D of each of the pair of the access transistors T5 and T6.

The driver transistors T1 and T2 that form the flip-flop circuit are, for example, n-channel type MOS transistors. The load transistors T3 and T4 are, for example, p-channel type TFTs. The access transistors T5 and T6 are, for example, n-channel type MOS transistors. As stated above, the SRAM according to the present embodiment is a so-called Advanced SRAM in which the load transistors are TFTs and capacitors each equivalent to a DRAM are added.

Subsequently, a specific structure of a semiconductor device corresponding to the SRAM memory cell illustrated in FIG. 2 will be described with reference to FIG. 3. However, the sectional view in FIG. 3 is not a view illustrating an aspect of the section in a specific region, but a view in which the elements illustrated in FIG. 2, such as the transistors and capacitors, are collected in order to explain a mode presented in the semiconductor device by the elements.

Figure 3:
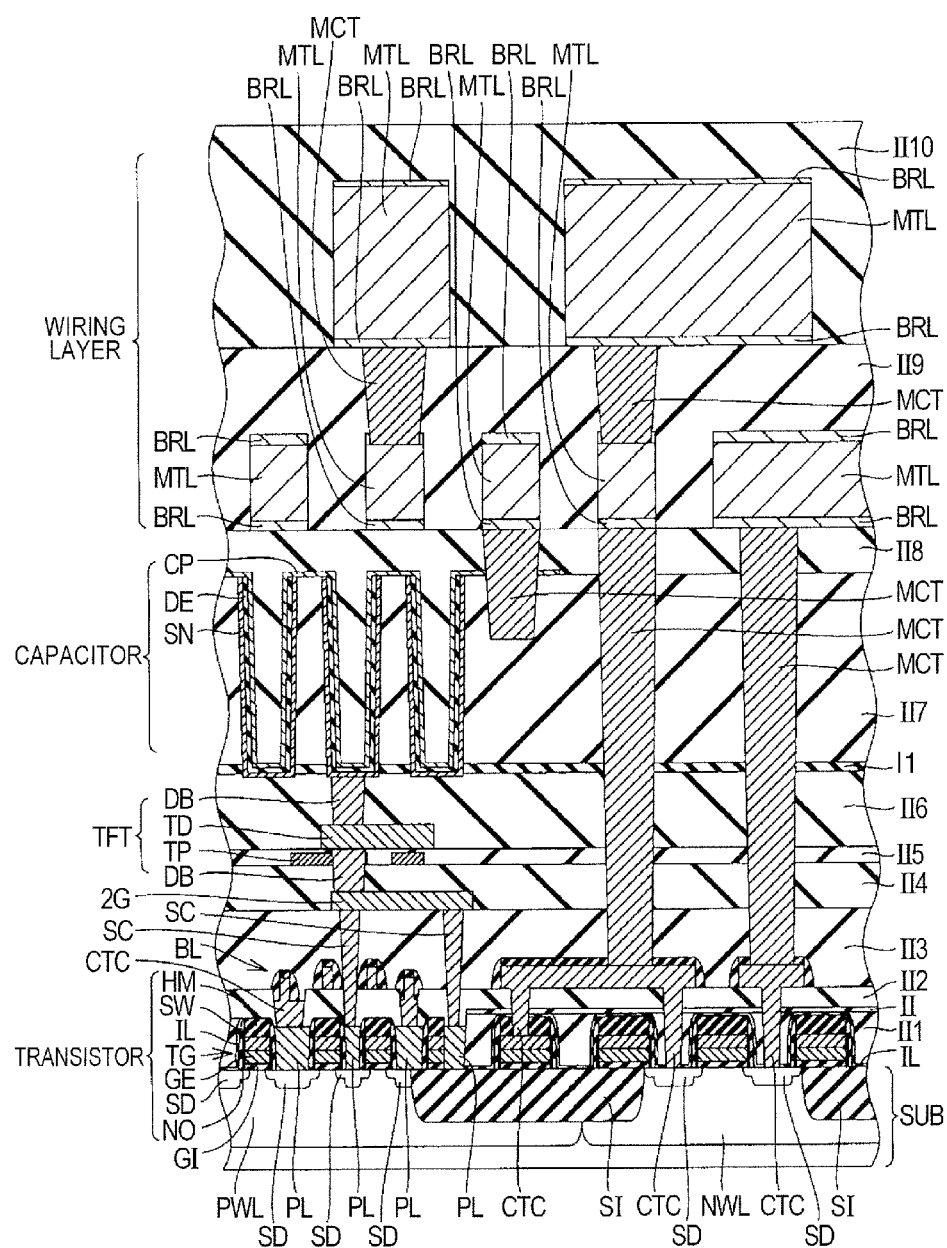
FIG. 3 is a schematic sectional view illustrating a specific structure corresponding to the equivalent circuit in FIG. 2.

With reference to FIG. 3, the left side of the view represents a region where the SRAM memory cell is formed, while the right side represents a region where a peripheral circuit is formed. The semiconductor device according to the present embodiment is formed over the major surface of a p-type semiconductor substrate SUB comprised of, for example, silicon single crystals.

The major surface of the semiconductor substrate SUB is electrically separated by an STI (Shallow Trench Isolation). This STI is formed by embedding an insulating film SI in a groove formed on the major surface of the semiconductor substrate SUB. A transistor TG for the SRAM memory cell and a transistor TG for the peripheral circuit are formed over the major surface of the semiconductor substrate SUB electrically separated by the STI.

In the region on the left side of the view where the memory cell is formed, a p-type well region PWL is formed over the major surface of the semiconductor substrate SUB. In the region on the right side of the view where the peripheral circuit is formed, a p-type well region PWL and an n-type well region NWL are formed. Each of the transistor TG for the SRAM memory cell and the transistor TG for the peripheral circuit has a pair of source/drain regions SD, a gate insulating film GI, and a gate electrode GE.

The pair of the source/drain regions SD are formed over the major surface of the semiconductor substrate SUB so as to be spaced apart from each other. The gate electrode GE is formed over the major surface of the semiconductor substrate SUB sandwiched by the pair of the source/drain regions SD, with the gate insulating film GI being interposed between the gate electrode GE and the major surface.

An insulating film HM is formed over the gate electrode GE. This insulating film HM is comprised of, for example, a laminated structure in which a silicon dioxide film, which has been formed by using TEOS (Tetra Ethyl Ortho Silicate) as a raw material, and a silicon nitride film are laminated each other. The insulating film HM functions as a film for stopping etching occurring when so-called self-aligned processing is performed by using the insulating film HM as a mask.

An insulating film NO is formed over the gate insulating film GI and the side wall of the gate electrode GE. A sidewall insulating film SW is formed over the side wall of a laminated structure in which the gate insulating film GI, the gate electrode GE, and the insulating film HM are laminated each other. The sidewall insulating film SW also functions as a film for stopping etching occurring when so-called self-aligned processing is performed by using the sidewall insulating film SW as a mask, in the same way as the insulating film HM.

Although the insulating film HM is formed over the gate electrode GE, the gate electrode GE is electrically coupled to another wiring in a region extending in the depth direction of FIG. 3, the region not being illustrated in the view.

A liner film IL, a first interlayer insulating film II1 and an insulating film II are formed, over the semiconductor substrate SUB, sequentially from down to up so as to cover the upper portion of each of the transistors TG for the SRAM memory cell and the peripheral circuit. In the region where the SRAM memory cell is formed, the liner film IL, the first interlayer insulating film II1, and the insulating film II, located over the source/drain region SD, are selectively removed and a plug conductive layer PL is formed in the removed portion.

A second interlayer insulating film II2 is formed over the insulating films HM and II, etc., so as to cover the upper portion of each of the transistors TG for the SRAM memory cell and the peripheral circuit. In the region where the SRAM memory cell is formed, a through-hole reaching the plug conductive layer PL is formed in the second interlayer insulating film II2 and a contact conductive layer CTC is formed in the through-hole. Wiring layers, such as the bit-line BL, extend over the second interlayer insulating film II2 so as to be electrically coupled to the contact conductive layer CTC.

In the region where the peripheral circuit is formed, contact holes, some of which reach the source/drain region SD from the upper surface of the second interlayer insulating film II2 and the others of which reach the gate electrode GE therefrom, are formed and a contact conductive layer CTC is formed in these contact holes. The wiring layer extends over the second interlayer insulating film II2 so as to be electrically coupled to the contact conductive layer CTC.

Interlayer insulating films II3, II4, II5, and II6, each of which is comprised of, for example, a silicon dioxide film, are sequentially formed over the second interlayer insulating film II2 so as to cover the wiring layer, and an insulating film I1 comprised of, for example, a silicon nitride film is formed so as to contact the upper surface of the interlayer insulating film II6. Further, interlayer insulating films II7, II8, II9, and II10, each of which is comprised of, for example, a silicon dioxide film, are sequentially formed so as to contact the upper surface of the insulating film I1.

A lower-layer wiring 2G is formed over the interlayer insulating film II3. The lower-layer wiring 2G is electrically coupled to the source/drain region SD of the transistor TG by, for example, the conductive layer SC and the plug conductive layer PL. It is preferable that the lower-layer wiring 2G is formed in a region that generally overlaps the capacitor, when viewed from above. It is preferable that the lower-layer wiring 2G is formed by, for example, a film of polycrystalline silicon in which impurities have been doped (hereinafter, referred to as "doped polysilicon"). Alternatively, when the transistor TG formed in a lower layer is, for example, an n-channel type transistor, the lower-layer wiring 2G may be formed by, for example, polycrystalline silicon including an n-type impurity ion, in order to make it easy to electrically couple the lower-layer wiring 2G to the transistor TG.

A conductive layer TP is formed over the interlayer insulating film II4. This conductive layer TP is a semiconductor layer comprised of polycrystalline silicon (polysilicon) and has both a channel region of TFTs as the load transistors T3 and T4 in the SRAM (see FIG. 1) and a pair of source/drain regions that sandwich the channel region. Part of a power supply wiring for supplying power to the TFTs is included in the conductive layer TP. It is preferable that the conductive layer TP is formed in a region that generally overlaps the capacitor, when viewed from above.

A gate electrode TD of the TFT is formed over the interlayer insulating film II5. It is preferable that the gate electrode TD is a semiconductor layer including doped polysilicon. It is preferable that the gate electrode TD is electrically coupled to the lower-layer wiring 2G by a conductive layer called a data node contact DB. The data node contact DB contacts, in the middle of its extension from the gate electrode TD toward the lower-layer wiring 2G, the end of the conductive layer TP to be electrically coupled thereto.

The data node contact DB is a conductive layer for forming the flip-flop circuit (cross-coupling) in the SRAM, and is formed by a semiconductor layer including doped polysilicon in the same way as, for example, the gate electrode TD. It is preferable that the data node contact DB is formed to extend in a direction appropriately perpendicular to the major surface of the semiconductor substrate SUB such that the data node contact DB penetrates the interlayer insulating films II4 and II5 from the gate electrode TD to the lower-layer wiring 2G.

Alternatively, the data node contact DB may be formed so as to electrically couple a layer over the gate electrode TD, e.g., the capacitor, to the gate electrode TD, or may be formed so as to electrically couple a layer below the lower-layer wiring 2G, e.g., the conductive layer SC, to the lower-layer wiring 2G. In this case, the data node contact DB may be formed so as to penetrate, for example, the capacitor, gate electrode TD, conductive layer TP, and lower-layer wiring 2G to reach the conductive layer SC.

A capacitor is formed over the interlayer insulating film II6. The capacitor has: a storage node SN that serves as a lower electrode; a cell plate CP that serves as an upper electrode; and a capacitor dielectric film DE. The capacitor dielectric film DE is sandwiched by the storage node SN and a cell plate CP. The storage node SN in the capacitor is electrically coupled to the data node contact DB by contacting the upper surface of the data node contact DB.

As seen in the cross-sectional view of FIG. 3, a metal wiring MTL is formed over, for example, the interlayer insulating film II8 and the interlayer insulating film II9, which are located over the capacitor. The metal wiring MTL is comprised of, for example, aluminum, an alloy of aluminum and copper, copper, tungsten, or the like. It is preferable that the upper surface and the lower surface of the metal wiring MTL are covered with a barrier metal BRL comprised of, for example, tantalum, titanium, titanium nitride, or the like. It is preferable that the coupling between the aforementioned metal wirings MTL and that between the metal wiring MTL and the bit-line BL are performed by a metal contact conductive layer MCT comprised of, for example, copper, tungsten, or the like.

Figure 5:
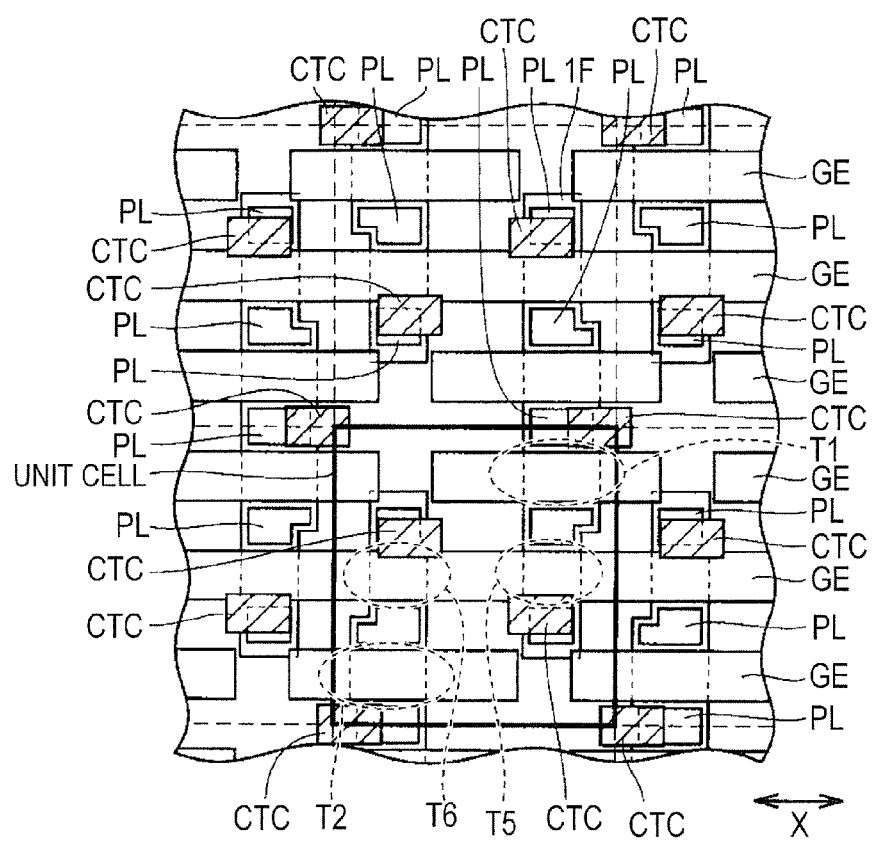
FIG. 5 is a schematic plan view of a second layer in the structure of the semiconductor device according to First Embodiment, the second layer being located second from the bottom of the structure.
Figure 6:
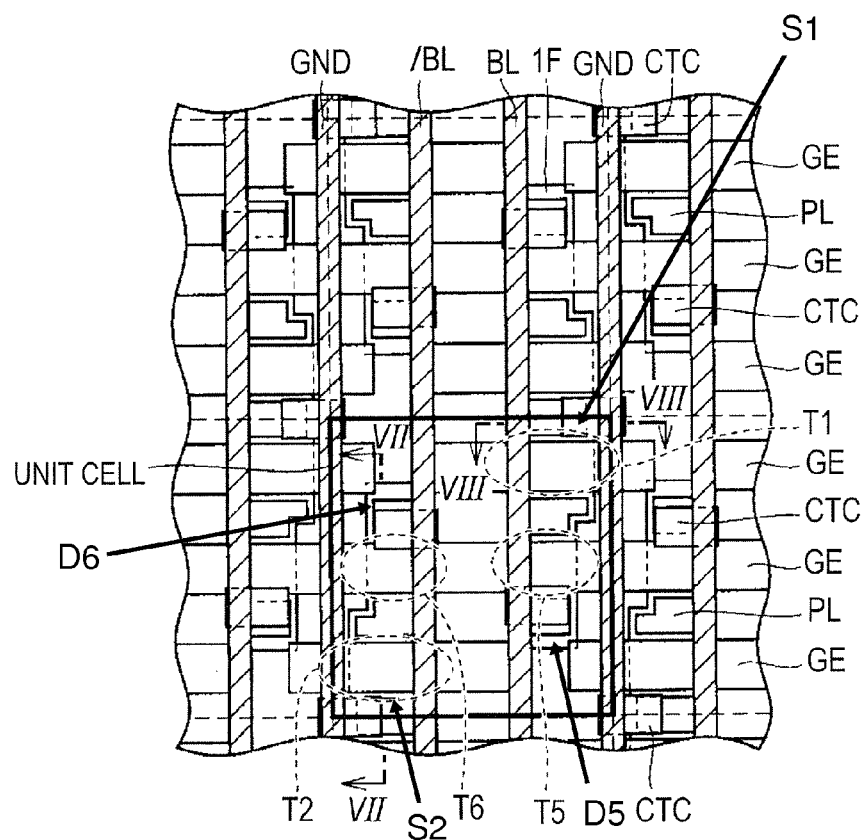
FIG. 6 is a schematic plan view of a third layer in the structure of the semiconductor device according to First Embodiment, the third layer being located third from the bottom of the structure.

Subsequently, a specific structure of the semiconductor device according to the present embodiment will be described with reference to FIGS. 4 to 8. The region enclosed by a heavy line in each of FIGS. 4 to 6 represents the region where one SRAM memory cell (unit cell) is formed.

Figure 4:
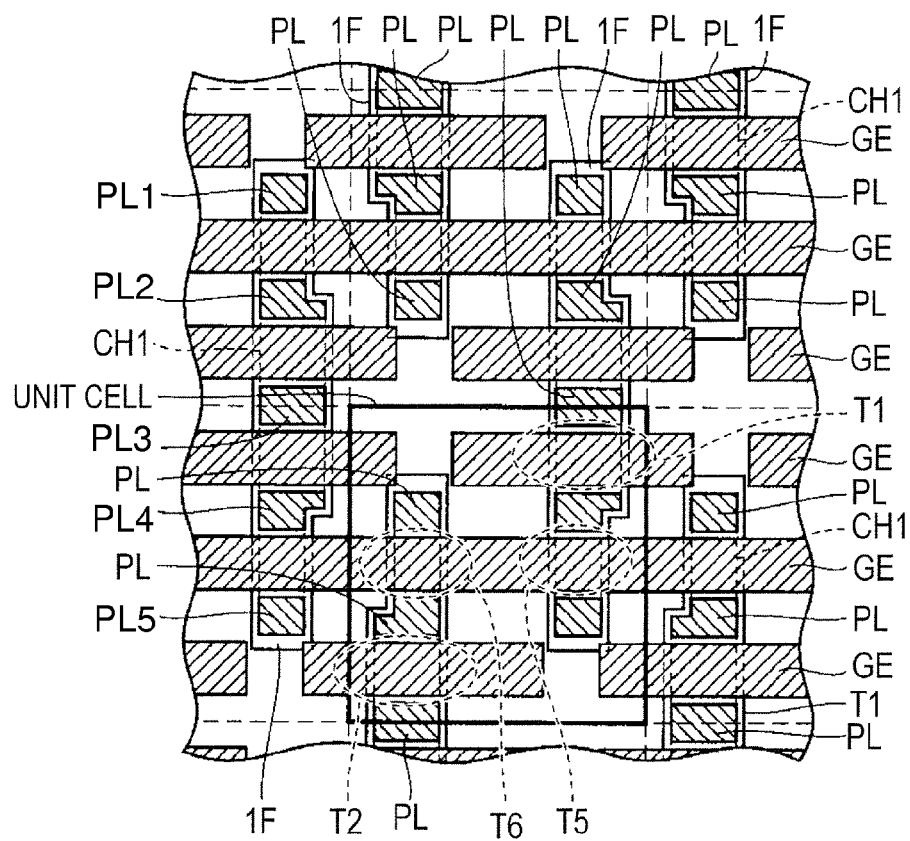
FIG. 4 is a schematic plan view of a first layer in the structure of the semiconductor device according to First Embodiment, the first layer being located first from the bottom of the structure.

With reference to FIG. 4, element isolation structures, such as the STI, are formed on the major surface of the semiconductor substrate SUB, by which a plurality of active regions 1F are electrically separated from each other over the major surface of the semiconductor substrate SUB. Each active region 1F extends in the vertical direction in FIG. 4. Each gate electrode GE extends in the horizontal direction in the view so as to perpendicularly intersect with one or more active regions 1F. Each of the transistors T1, T2, T5, and T6, which are included in the SRAM memory, is formed around the intersection between an active region 1F and a gate electrode GE.

Figure 7:
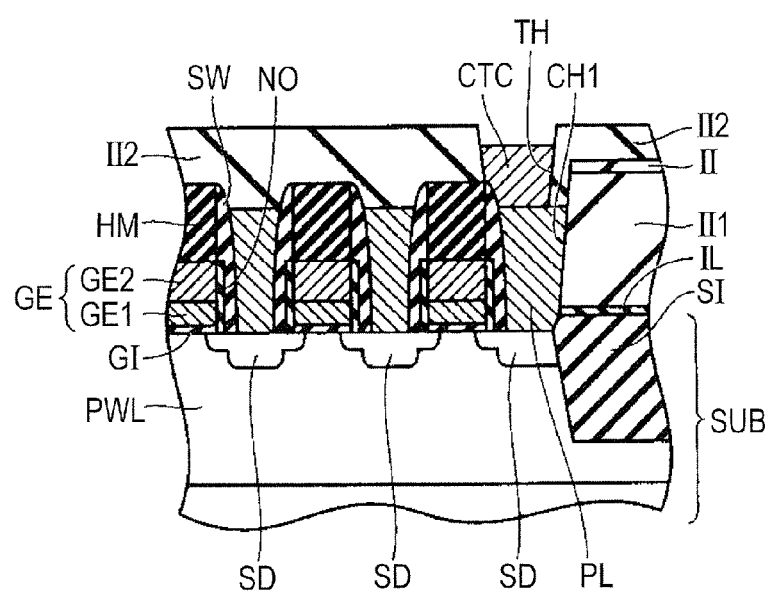
FIG. 7 is a schematic sectional view, taken along Line VII-VII in FIG. 6.

With reference to FIG. 7, each of the transistors T1, T2, T5, and T6 has: the pair of the source/drain regions SD formed over the major surface of the semiconductor substrate SUB; and the gate electrode GE formed over the major surface thereof sandwiched by the pair of the source/drain regions SD, with the gate insulating film GI being interposed between each of the transistors and the major surface.

With reference to FIG. 4, the drain region of the driver transistor T1 and the source region of the access transistor T5 are formed, in the unit cell, by a common impurity region such that the two regions are electrically coupled to each other. The drain region of the driver transistor T2 and the source region of the access transistor T6 are formed by a common impurity region such that the two regions are electrically coupled to each other. The gate electrode GE of the access transistor T5 and that of the access transistor T6 are formed, by a common conductive layer, so as to be integrally formed with each other and having unitary construction such that the two gate electrodes GE are electrically coupled to each other.

Between the unit cells adjacent to each other on one side in the vertical direction in FIG. 4, the source region of the driver transistor T1 in one of the unit cells and that in the other unit cell are formed by a common impurity region such that the two regions are electrically coupled to each other. Also, between the unit cells adjacent to each other on the opposite in the vertical direction in the view, the source region of the driver transistor T2 in one of the unit cells and that in the other unit cell are formed by a common impurity region such that the two regions are electrically coupled to each other. Also, between the unit cells adjacent to each other in the horizontal direction in the view, the gate regions GE of the access transistors T5 and T6 in one of the unit cells and those in the other unit cell are formed to be integral with each other such that the gate electrodes are electrically coupled to each other.

With reference to FIG. 7, the gate electrode GE of each of the transistors T1, T2, T5, and T6 has a so-called polycide structure in which, for example, a doped polysilicon film GE1 and a tungsten silicide film GE2 are laminated with each other. Alternatively, the gate electrode GE of each of the transistors T1, T2, T5, and T6 may be comprised of a single layer of the doped polysilicon film.

The insulating film HM is formed over the gate electrode GE. This insulating film HM is comprised of a laminated structure in which a silicon dioxide film formed by using, for example, TEOS (Tetra Ethyl Ortho Silicate) as a raw material, and a silicon nitride film are laminated with each other.

The insulating film NO comprised of, e.g., a silicon dioxide film is formed over the gate insulating film GI and the side wall of the gate electrode GE. The sidewall insulating film SW is formed over the side wall of the laminated structure in which the gate insulating film GI, the gate electrode GE, and the insulating film HM are laminated with each other, so as to cover the side of the insulating film NO. The sidewall insulating film SW may be formed by a silicon nitride film or by a combination of a silicon dioxide film and a silicon nitride film.

Figure 8:
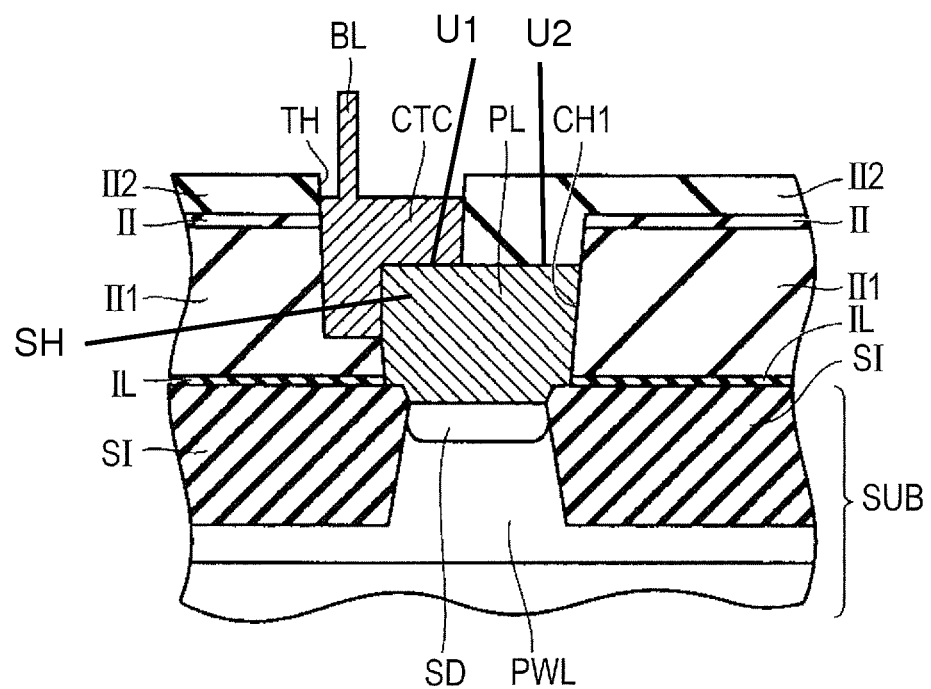
FIG. 8 is a schematic sectional view, taken along Line VIII-VIII in FIG. 6.

With reference to FIGS. 7 and 8, the liner film IL, the first interlayer insulating film II1 and the insulating film II are formed over the major surface of the semiconductor substrate SUB sequentially from down to up. In the region where the SRAM memory cell is formed, the liner film IL, the first interlayer insulating film II1, and the insulating film II, which are located over the source/drain region SD, are selectively removed. Thereby, a contact hole CH1 ("first hole"), which penetrates the liner film IL, the first interlayer insulating film II1, and the insulating film II to reach the source/drain region SD, is formed. The plug conductive layer PL coupled to the source/drain region SD is formed in the contact hole CH1. The upper surface of the plug conductive layer PL is located at a level lower than that of the upper surface of the first interlayer insulating film II1, and is located at a level lower than or equal to that of the upper surface of the insulating film HM.

With reference to FIG. 4, the contact hole CH1 is opened such that the pair of the source/drain regions SD of the driver transistor (T1 or T2) and the upper portion of the pair of the source/drain regions SD of the access transistor (T5 or T6), the two transistors being located in one active region 1F, are joined together. Accordingly, the contact hole CH1 is opened so as to extend between the unit cells adjacent to each other in the vertical direction in FIG. 4. In the present embodiment, five plug conductive layers (marked PL1, PL2, PL3, PL4 and PL5 in FIG. 4), which are separated from each other, are arranged in the opening of one contact hole CH1. This plug conductive layer PL is comprised of, e.g., a doped polysilicon film.

With reference to FIGS. 7 and 8, the second interlayer insulating film II2 is formed over the plug conductive layer PL and the insulating films HM and II, etc. A plurality of through-holes TH ("second hole") are formed in the second interlayer insulating film II2. The through-holes TH include a through-hole TH reaching the plug conductive layer PL coupled to the drain region of each of the access transistors T5 and T6 and a through-hole TH reaching the plug conductive layer PL coupled to the source region of each of the driver transistors T1 and T2.

Part of the upper surface of the plug conductive layer PL and part of the side surface thereof are exposed from each of the through-holes TH. Each of the through-holes TH (hole for contact conductive layer) is formed so as to be coupled to the contact hole CH1 (hole for plug conductive layer) in the first interlayer insulating film II1.

The contact conductive layer CTC is formed in the through-hole TH. This contact conductive layer CTC is formed so as to contact both a first part U1 of the upper surface and a part of the side surface of the plug conductive layer PL exposed from the through-hole TH. As seen in the cross-section of FIG. 8, the contact conductive layer CTC wraps around a shoulder portion SH of the conductive plug layer PL, thereby forming a non-planar interface between the contact conductive layer CTC and the conductive plug layer PL. It is understood from the figures that, relative to the substrate SUB, the interface between the contact conductive layer CTC and the conductive plug layer PL extends in three dimensions. The contact conductive layer CTC is formed by, e.g., a Ti (titanium)/TiN (titanium nitride) layer and a W (tungsten)

layer. As also seen in FIG. 8, a second part U2 of the upper surface of the conductive plug layer PL is covered by the second interlayer insulating film II2.

With reference to FIG. 5, the contact conductive layer CTC is formed so as to protrude (shift) in the channel width direction (horizontal direction in FIG. 5) of each of the transistors T1, T2, T5, and T6 with respect to the plug conductive layer PL to which the contact conductive layer CTC is coupled, when viewed from above (when viewed from a direction perpendicular to the major surface of the semiconductor substrate SUB). Thereby, the contact conductive layer CTC is coupled to at least one of the two (horizontally facing) side surfaces of the plug conductive layer PL, the both two surfaces facing in opposite directions in the channel width direction.

With reference to FIG. 8, wiring layers, such as the bit-line BL, are formed over the second interlayer insulating film II2 so as to be electrically coupled to the contact conductive layer CTC. The wiring layers, such as the bit-line BL, have unitary construction and are formed integrally with each other by the same layer as the contact conductive layer CTC to which the wiring layers are coupled. Accordingly, the wiring layers, such as the bit-line BL, are formed by a Ti (titanium)/TiN (titanium nitride) layer and a W (tungsten) layer, which are the same materials as those of the contact conductive layer CTC.

With reference to FIG. 6, the bit-line BL is electrically coupled to the drain region (pointed to approximately by D5) of the access transistor T5 via the contact conductive layer CTC and the plug conductive layer PL. The bit-line /BL is electrically coupled to the drain region (pointed to approximately by D6) of the access transistor T6 via the contact conductive layer CTC and the plug conductive layer PL. The ground wiring GND is electrically coupled to the source region (pointed to approximately by S1) of the driver transistor T1 via the contact conductive layer CTC and the plug conductive layer PL. The ground wiring GND is electrically coupled to the source region (pointed to approximately by S2) of the driver transistor T2 via the contact conductive layer CTC and the plug conductive layer PL.

As stated above, each of the wiring layers of the bit-lines BL and /BL and the ground wiring GND is formed by the same material as that of the contact conductive layer CTC. In addition, each of the wiring layers BL, /BL, and GND has, in a region not located directly over the plug conductive layer PL, a portion coupled to the contact conductive layer CTC. It is preferable that each of the wiring layers BL, /BL, and GND is arranged in a region such that the entire length of the wiring layer is not located directly over the plug conductive layer PL. Also, it is preferable that each of the wiring layers BL, /BL, and GND intersects the region where the memory cell is formed by linearly extending through the region, when viewed from above.

The structure of a layer located over each of the wiring layers BL, /BL, and GND is approximately the same as that described with reference to FIG. 3, and accordingly the description thereof will not be repeated.

Figures 9A, 9B, 9C:
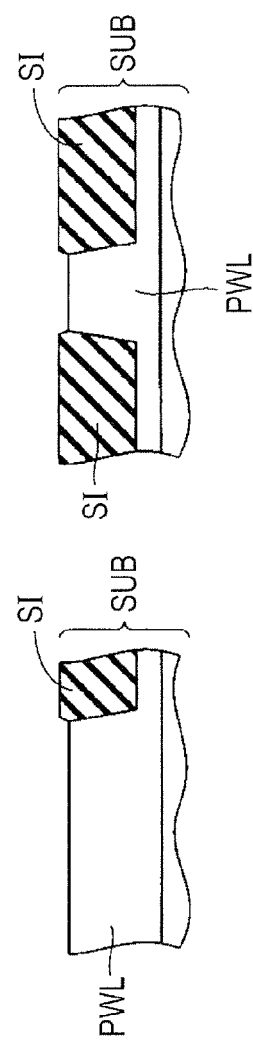

Subsequently, a method of manufacturing the semiconductor device according to the present embodiment will be described. With reference to FIGS. 9A, 9B, and 9C, the insulating film SI, which forms the element isolation structure over the silicon substrate SUB, is formed from, for example, a silicon dioxide film. An ion implantation and a heat treatment are then performed to form the p-type well region PWL and the n-type well region NWL.

With reference to FIGS. 10A, 10B, and 10C, the gate insulating film GI and the gate electrode GE are formed. The gate electrode GE is formed to have a so-called polycide structure in which, for example, the doped polysilicon film GE1 and the tungsten silicide film GE2 are laminated with each other. The insulating film HM, which functions as an etching stopper film when the subsequent step of SAC (Self Align Contact) is performed, is formed over the gate electrode GE. The insulating film HM is formed from, for example, a single layer of an SiN layer or a multi-layer of an SiN film and a TEOS film (SiO2 film).

The insulating film NO comprised of a silicon dioxide film is then formed over the side wall of the gate electrode GE by oxidation for relaxing an electric field in a transistor, etc. Subsequently, an ion implantation for forming source/drain, etc., is performed, and the sidewall insulating film SW covering the gate insulating film GI, the gate electrode GE, and the side wall of the insulating film HM is then formed from, e.g., an insulating film, such as an SiN film. Thereafter, an ion implantation for forming source/drain is further performed to form the source/drain region SD having an LDD (Lightly Doped Drain) structure.

With reference to FIGS. 11A, 11B, and 11C, the liner film IL comprised of, for example, an SiN film, is formed over the whole surface.

Figure 12A:
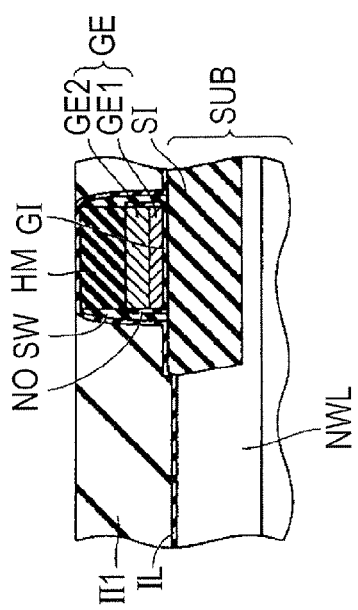
Figure 12B:
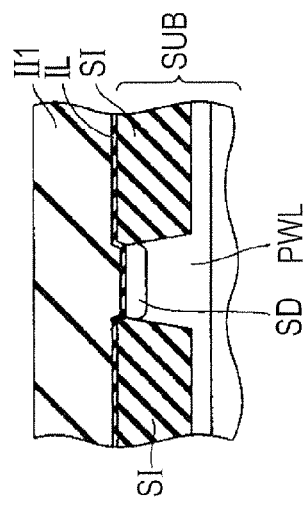
Figure 12C:
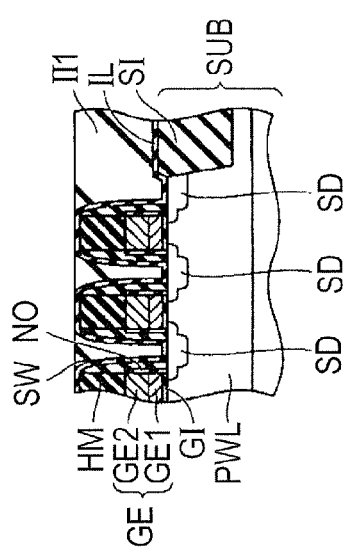

With reference to FIG. 12A, 12B, and 12C, the first interlayer insulating film II1 comprised of, for example, BP (Boro Phospho) TEOS, etc., is formed over the liner film IL. This first interlayer insulating film II1 is flattened to some extent by being subjected to a heat treatment. Subsequently, the first interlayer insulating film II1 is ground and partially removed by performing CMP (Chemical Mechanical Polishing) processing thereon without exposing the liner film IL, thereby allowing the upper surface of the first interlayer insulating film II1 to be flattened.

With reference to FIGS. 13A, 13B, and 13C, the insulating film II comprised of, for example, a silicon dioxide film whose raw material is TEOS, is formed over the flattened first insulating film II1. A resist pattern PR1 is formed over the insulating film II by a normal photoengraving technique. The insulating film II and the first interlayer insulating film II1 are selectively removed by the etching in which the resist pattern PR1 is used as a mask. Subsequently, the resist pattern PR1 is removed by, for example, ashing, etc.

With reference to FIGS. 14A, 14B, and 14C, an opening is formed in each of the insulating film II and the first interlayer insulating film II1 by the aforementioned etching removal of the insulating film II and the first interlayer insulating film II1, thereby allowing the liner film IL, located below the first interlayer insulating film II1, to be exposed. The exposed liner film IL in the opening is then removed by etching.

Figure 15C:
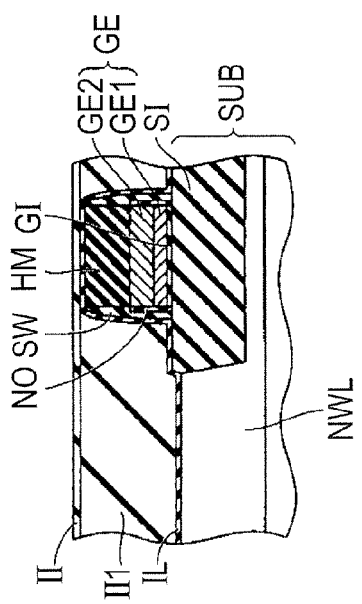
Figure 15B:
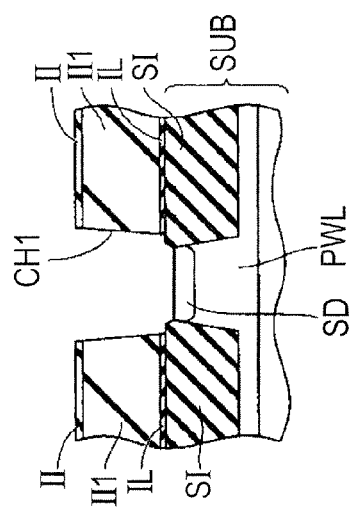
Figure 15A:
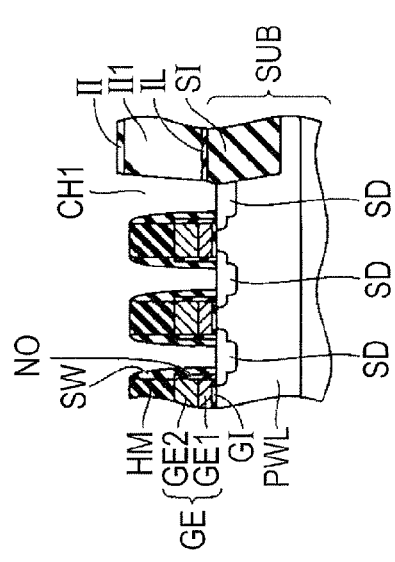

With reference to FIGS. 15A, 15B, and 15C, the contact hole CH1 by which the source/drain region SD is exposed is formed in each of the insulating films IL, II1, and II by the aforementioned etching removal of the liner film IL.

Figure 16C:
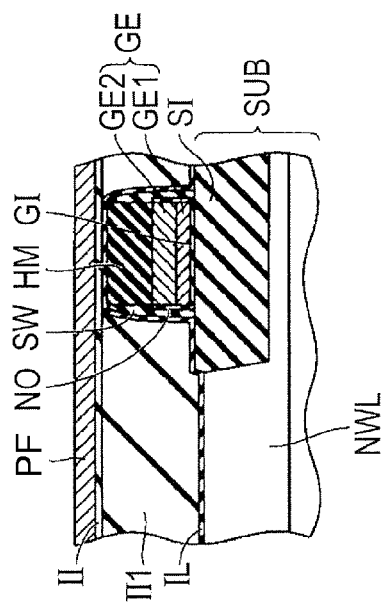
Figure 16B:
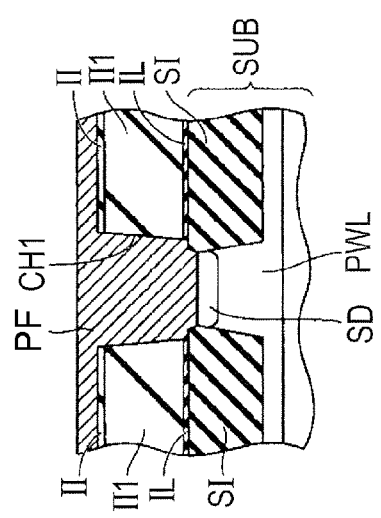
Figure 16A:
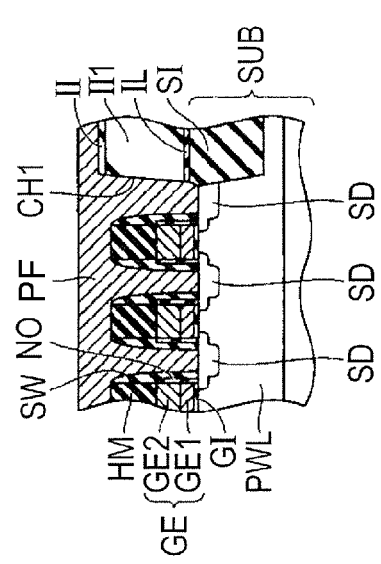

With reference to FIGS. 16A, 16B, and 16C, the first conductive layer PF, comprised of doped polysilicon in which, for example, phosphorus has been doped, is formed over the insulating film II so as to occupy the inside of the contact hole CH1. Entire surface etchback is performed on the first conductive layer PF.

With reference to FIG. 17A, 17B, and 17C, by the aforementioned entire surface etchback, the upper surface of the first conductive layer PF is located at a level lower than that of the upper surface of each of the insulating films II and II1, and is located at a level lower than or equal to that of the upper surface of the insulating film HM. Thereby, the individual plug conductive layers PL, each separated from one another and originally part of the first conductive layer PF, are formed.

The plug conductive layers PL in a single contact hole CH1 are separated from each other by the gate electrode GE.

Figure 18A:
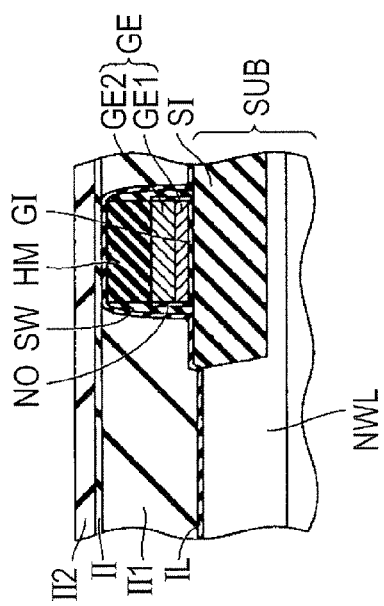
Figure 18B:
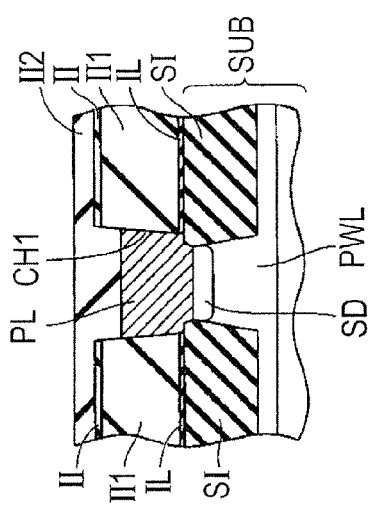
Figure 18C:
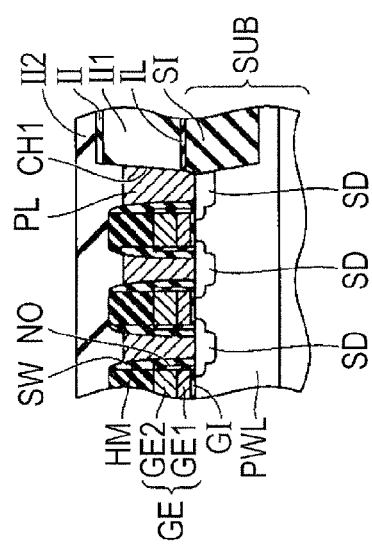

With reference to FIGS. 18A, 18B, and 18C, the second interlayer insulating film II2 is formed over the whole surface. This second interlayer insulating surface II2 may or may not be comprised of the same material as that of the first interlayer insulating film II1.

With reference to FIGS. 19A, 19B, and 19C, the peripheral contact holes CH2 are formed, by using a normal photoengraving technique and etching technique, in the region where the peripheral circuit is formed. These peripheral contact holes CH2 include one reaching the gate electrode GE and one reaching the impurity region over the major surface of the semiconductor substrate SUB.

Figure 20A:
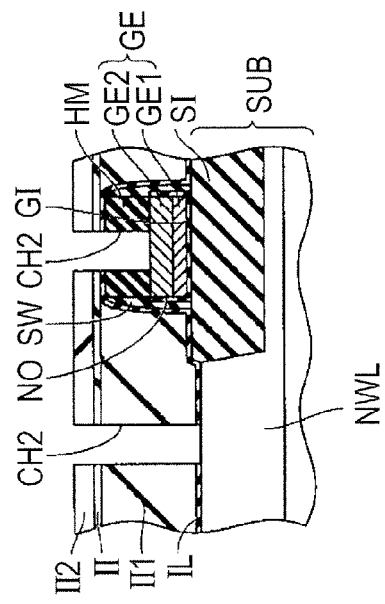
Figure 20B:
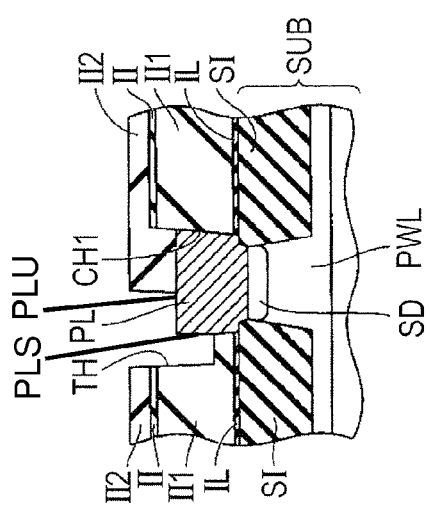
Figure 20C:
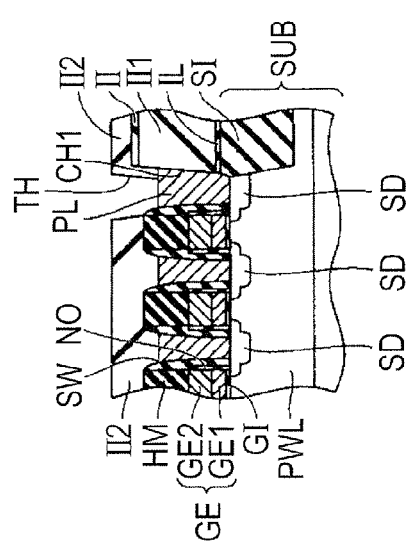

With reference to FIGS. 20A, 20B, and 20C, the through-hole TH is formed, by using a normal photoengraving technique and etching technique, in the region where the memory cell is formed. This through-hole TH is formed so as to expose both part of the upper surface PLU of the plug conductive layer PL and part of the side surface PLS thereof. That is, the through-hole TH is formed so as to reach the inside of the first interlayer insulating film II1 to be electrically coupled to the contact hole CH1 there.

With reference to FIGS. 21A, 21B, and 21C, the second conductive layer CF is formed over the second interlayer insulating film II2 so as to occupy the inside of each of the through-hole TH and the peripheral contact hole CH2. This second conductive layer CF is formed from, for example, a barrier metal layer of Ti/TiN and a wiring layer of W.

Figure 22A:
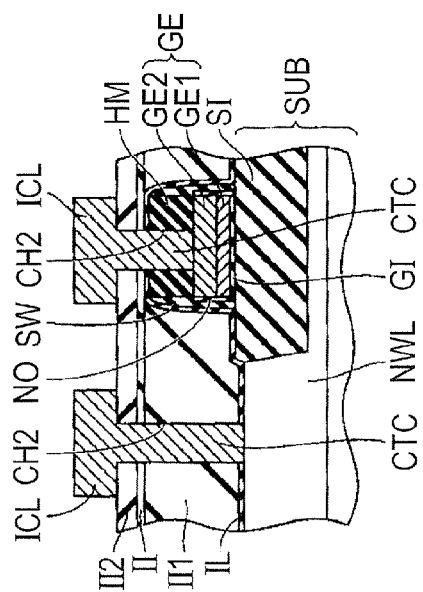
Figure 22B:
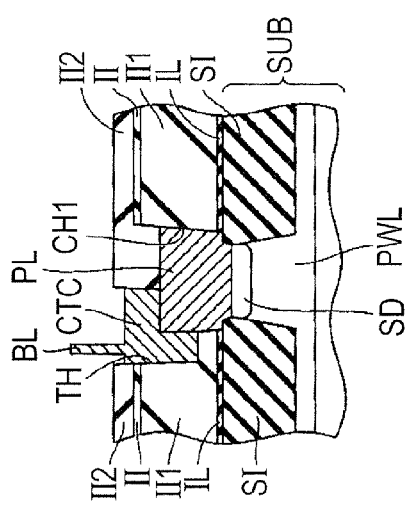
Figure 22C:
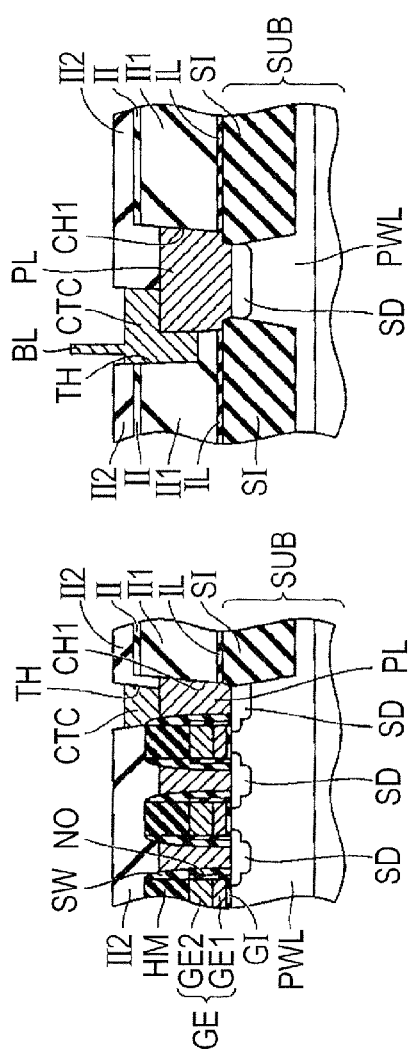

With reference to FIGS. 22A, 22B, and 22C, the second conductive layer CF is patterned by using a normal photoengraving technique and etching technique. Thereby, the contact conductive layer CTC and the wiring layers BL, /BL, and GND have unitary construction and are formed integrally with each other from the second conductive layer CF to the region where the memory cell is formed, and a wiring layer ICL is formed in the region where the peripheral circuit is formed. Thus, the semiconductor device according to the present embodiment is manufactured.

Subsequently, after a related art illustrated in FIGS. 23 to 34 is described, operations and effects of the present embodiment will be described in contrast with the related art.

Figure 23:
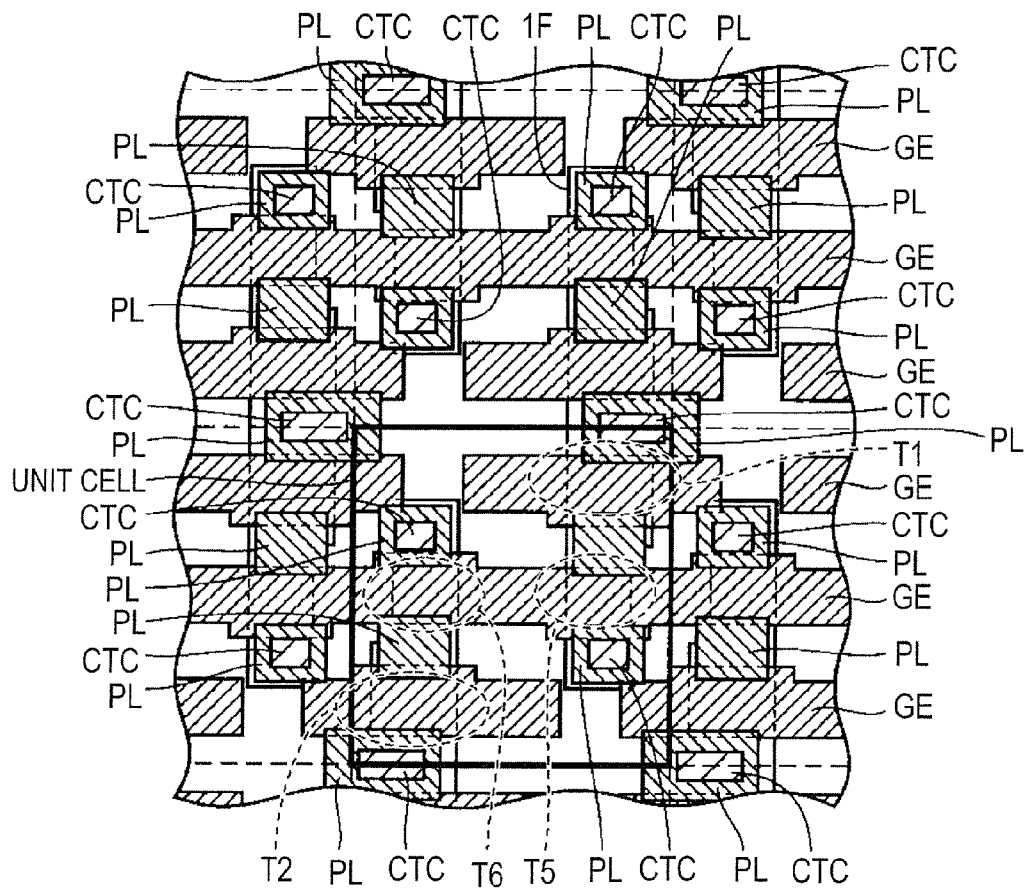
FIG. 23 is a schematic plan view of a first layer in a structure of a semiconductor device according to a related art, the first layer being located first from the bottom of the structure.
Figure 24:
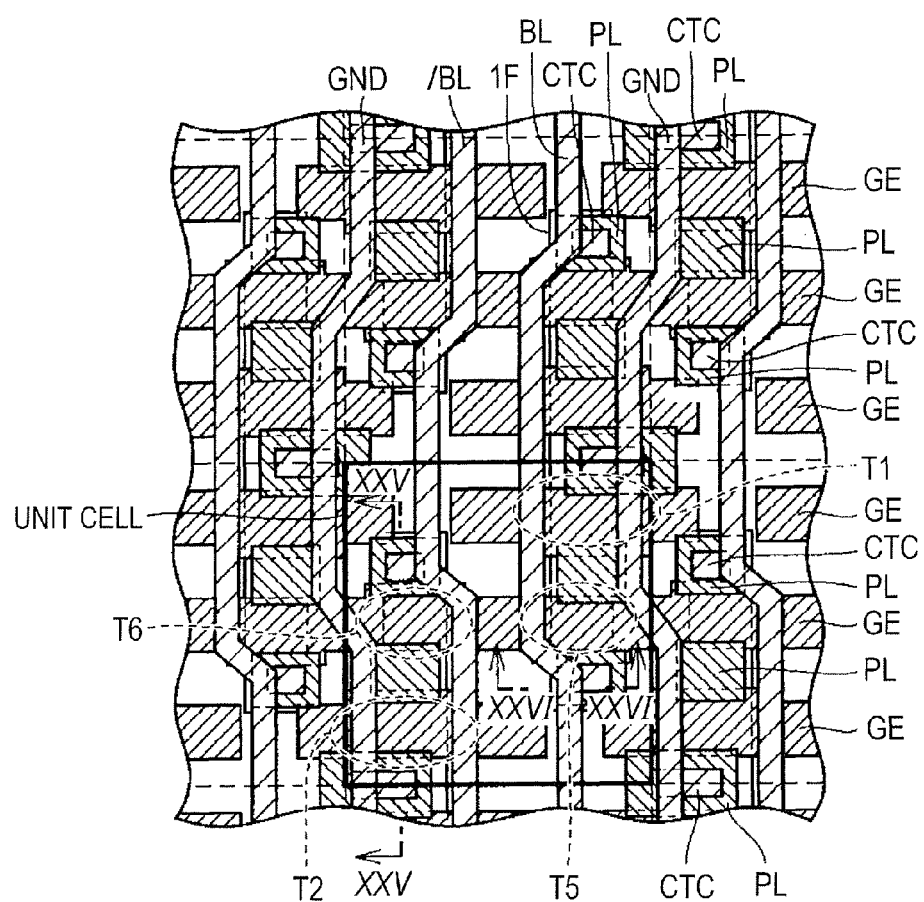
FIG. 24 is a schematic plan view of a second layer in the structure of the semiconductor device according to the related art, the second layer being located second from the bottom of the structure.
Figure 25:
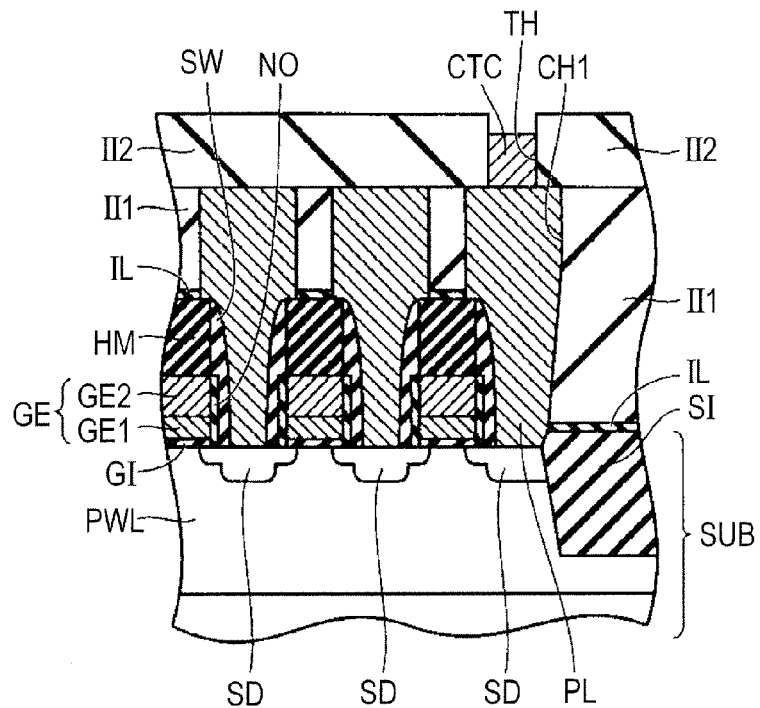
FIG. 25 is a schematic sectional view, taken along Line XXV-XXV in FIG. 24.
Figure 26:
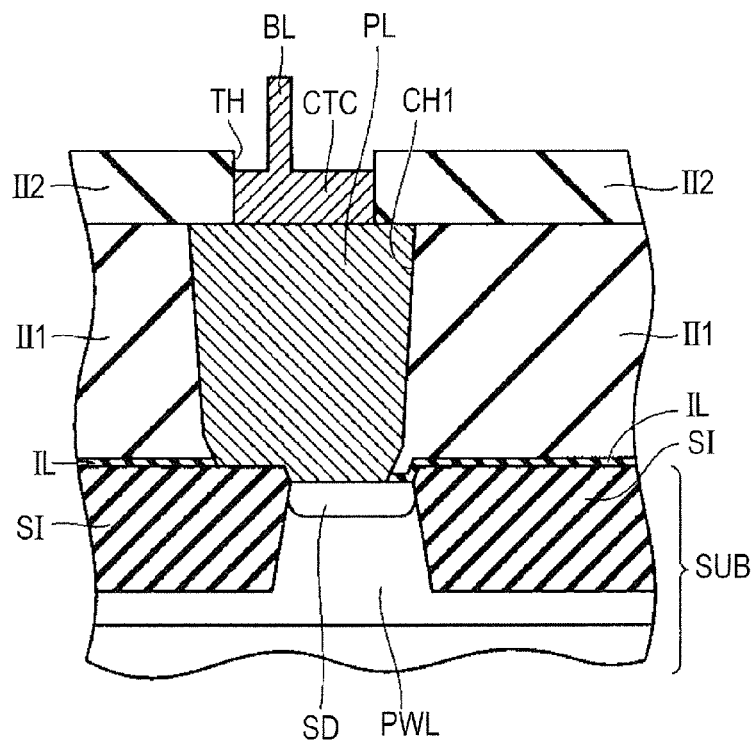
FIG. 26 is a schematic sectional view, taken along Line XXVI-XXVI in FIG. 24.

With reference to FIGS. 23 to 26, a structure according to the related art is different from that according to the present embodiment in that the contact conductive layer CTC is formed to contact only the upper surface of the plug conductive layer PL. Accordingly, in the structure according to the related art, the size of the upper surface of the plug conductive layer PL is large and the contact conductive layer CTC does not protrude from the position where the plug conductive layer PL is arranged, when viewed from above, as illustrated in FIG. 23. Also, in the unit cell, each of the wiring layers BL, /BL, and GND cannot be arranged linearly and bends, when viewed from above, as illustrated in FIG. 24, Also, as illustrated in FIG. 25, the upper surface of the plug conductive layer PL is located at a level equal to that of the upper surface of the first interlayer insulating film II1 and located at a level higher than that of the upper surface of the insulating film HM over the gate is electrode GE. Also, as illustrated in FIG. 26, each of the wiring layers BL, /BL, and GND is located in a region located directly over the plug conductive layer PL to which each of them is to be electrically coupled. Thus, as also seen in the cross-section of FIG. 26, the contact conductive layer CTC does not wrap around a shoulder portion of the conductive plug layer PL, and so only a planar interface is formed between the contact conductive layer CTC and the conductive plug layer PL.

Structures according to the related art, other than the aforementioned structure, are approximately the same as those according to the present embodiment, and hence like elements are denoted with like reference numerals and description thereof will not be repeated.

A manufacturing method according to the related art is, for example, as follows. In the manufacturing method according thereto, the same steps as those in the present embodiment illustrated in FIGS. 9A to 11C are first performed. Subsequently, with reference to FIGS. 27A to 27C, the first interlayer insulating film II1 is formed so as to cover the transistor.

With reference to FIGS. 28A to 28C, the contact holes CH1 are formed in the first interlayer insulating film II1. One contact hole CH1 is formed for each source/drain region SD.

With reference to FIGS. 29A to 29C, the first conductive layer PF is formed over the first interlayer insulating film II1 so as to occupy each contact hole CH1. Entire surface etchback processing or CMP processing is performed on the first conductive layer PF.

With reference to FIGS. 30A to 30C, the first conductive layer PF is ground and removed by the aforementioned entire surface etchback processing or CMP processing, thereby allowing the upper surface of the first interlayer insulating film II1 to be exposed. Thereby, the individual plug conductive layers PL occupying the contact holes CH1 are formed from the first conductive layer PF.

With reference to FIGS. 31A to 31C, the second interlayer insulating film II2 is formed over the first interlayer insulating film II1 and the plug conductive layer PL.

With reference to FIGS. 32A to 32C, the through-holes TH and the peripheral contact holes CH2 are formed in the second interlayer insulating film II2. The through-hole TH is formed so as to expose only the upper surface of the plug conductive layer PL. The peripheral contact hole CH2 is formed so as to reach the gate electrode GE or the impurity region over the major surface of the semiconductor substrate SUB.

With reference to FIGS. 33A to 33C, the second conductive layer CF is formed over the second interlayer insulating film II2 so as to occupy the inside of each of the through-hole TH and the peripheral contact hole CH2.

Figures 34A, 34B, 34C:
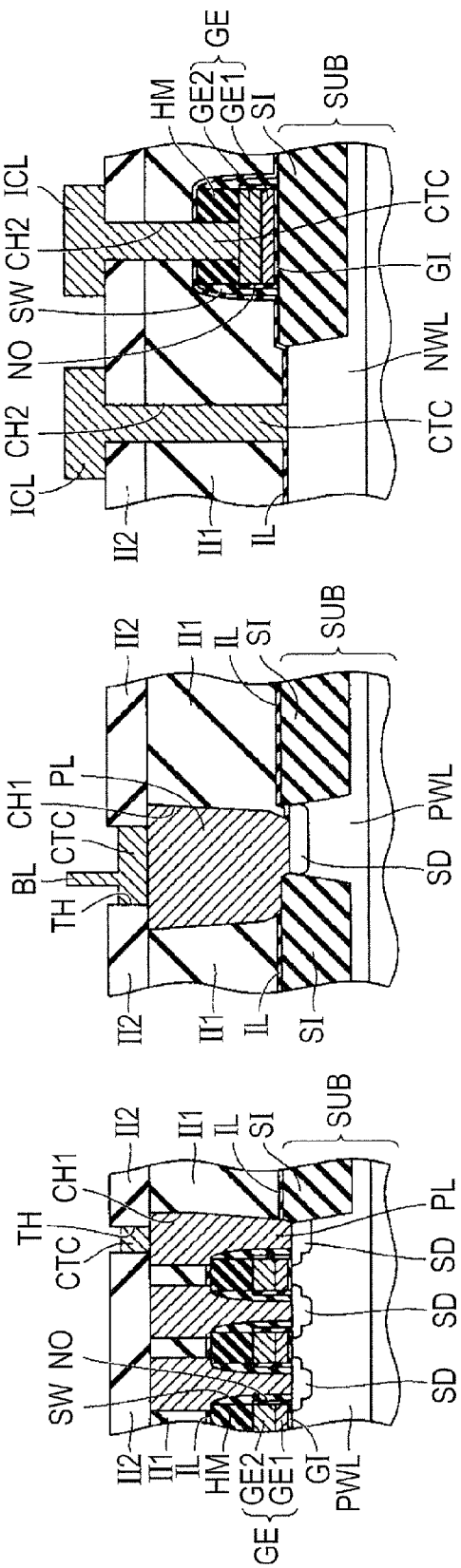

With reference to FIGS. 34A to 34C, the contact conductive layer CTC, the wiring layers BL, /BL, and GND, and the wiring layer ICL are formed from the second conductive layer CF by patterning the second conductive layer CF. Thus, the semiconductor device according to the related art is manufactured.

In the structure according to the related art, the contact conductive layer CTC is formed so as to contact only the upper surface of the plug conductive layer PL, as illustrated in FIG. 26, and hence it is required that the size of the upper surface of the plug conductive layer PL be sufficiently large. However, with the miniaturization of the device, it becomes difficult to form a pattern of the plug conductive layer PL having an upper surface with such a large size.

Also, it is needed to arrange the three wiring layers BL, /BL, and GND, which are wired in the region where one memory cell is formed, in a bent manner in order to couple to the through-hole TH. Under the constraint that the contact conductive layer CTC is coupled only to the upper surface of the plug conductive layer PL, however, it becomes difficult with the miniaturization of the device to arrange the contact conductive layer CTC.

By forming the contact conductive layer CTC and wiring layers, such as the bit-line BL, to have unitary construction and thus integrally with each other from the same layer, as illustrated in FIG. 26, a margin for the falling of the wiring layers, such as the bit-line BL, is improved. However, because the size of the contact conductive layer CTC becomes small due to the miniaturization of the device, and because the scaling also occurs in the longitudinal direction, the depth of the through-hole TH becomes shallow, thereby causing the margin for the falling of the wiring layers, such as the bit-line BL, to be little.

On the other hand, in the present embodiment, the contact conductive layer CTC is formed so as to contact both the upper surface and the side surface of the plug conductive layer PL, as illustrated in FIG. 8. Accordingly, it becomes easy to reliably couple the plug conductive layer PL and the contact conductive layer CTC to each other. Accordingly, the plug conductive layer PL and the contact conductive layer CTC can be reliably coupled to each other, even when the size of the upper surface of the plug conductive layer PL is made small with the miniaturization of the device.

Also, in the present embodiment, the contact conductive layer CTC is formed so as to contact both the upper surface and the side surface of the plug conductive layer PL, as illustrated in FIG. 8. Accordingly, a degree of freedom for arranging the wiring layers BL, /BL, and GND, which are formed integrally with the contact conductive layer CTC, is improved. Thereby, the three wiring layers BL, /BL, and GND can be easily arranged at equal pitches, even when the device is miniaturized.

In the present embodiment, the contact conductive layer CTC is formed so as to contact both the upper surface and the side surface of the plug conductive layer PL, as illustrated in FIG. 8. Accordingly, the contact conductive layer CTC can be extended downward to a position deeper than that of the contact conductive layer CTC according to the related art. Thereby, a large margin for the falling of the wiring layers BL, /BL, and GND can be secured, and they can also be arranged linearly. Further, the margin, occurring when photoengraving is performed, can be enlarged by linearly arranging a pattern, in comparison with the case where the pattern is arranged in a bent manner.

In the present embodiment, the wiring layers BL, /BL, and GND are coupled to the contact conductive layer CTC in a region not located directly over the plug conductive layer PL, as illustrated in FIG. 8. Thereby, a degree of freedom for arranging the wiring layers BL, /BL, and GND, occurring when viewed from above, is improved.

In the present embodiment, the contact hole CH1 and the through-hole TH are formed so as to be coupled to each other in the first interlayer insulating film IL1, as illustrated in FIG. 8. Thereby, the contact conductive layer CTC can be extended downward to a position deeper than that of the contact conductive layer CTC according to the related art, thereby allowing a large margin for the falling of the wiring layers BL, /BL, and GND to be secured.

In the present embodiment, the upper surface of the plug conductive layer PL is located at a level lower than that of the upper surface of the interlayer insulating film. Thereby, thickness of the contact conductive layer CTC formed over the plug conductive layer PL must be increased. Accordingly, the falling of the wiring layers can be suppressed.

In the present embodiment, the contact conductive layer CTC is arranged so as to protrude in the channel width direction of the transistor TG with respect to the plug conductive layer PL, when viewed from above, as illustrated in FIG. 5. Accordingly, a degree of freedom for arranging, in the channel width direction, the wiring layers BL, /BL, and GND, which are to be coupled to the contact conductive layer CTC, is improved.

In the present embodiment, the area of the plug conductive layer PL facing the gate electrode GE can be reduced, as illustrated in FIG. 4 or FIG. 7, and accordingly, the bit-line capacitance between the gate electrode GE and the plug conductive layer PL can be reduced.

(Second Embodiment)

In First Embodiment, the bottom of the contact conductive layer CTC does not reach the liner film IL (i.e., the bottom of the contact conductive layer CTC is comprised of the second interlayer insulating film IL2), as illustrated in FIG. 8. However, in the present embodiment of FIG. 35, the bottom of the contact conductive layer CTC may reach the liner film IL. That is, the bottom of the contact conductive layer CTC may be comprised of the liner film IL.

Structures according to the present embodiment, other than the aforementioned structure, are approximately the same as the structures according to First Embodiment illustrated in FIG. 8, and hence like elements are denoted with like reference numerals and description thereof will not be repeated.

Figure 36A:
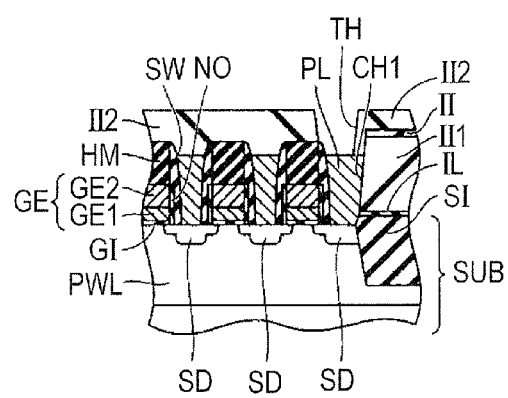
Figure 36B:
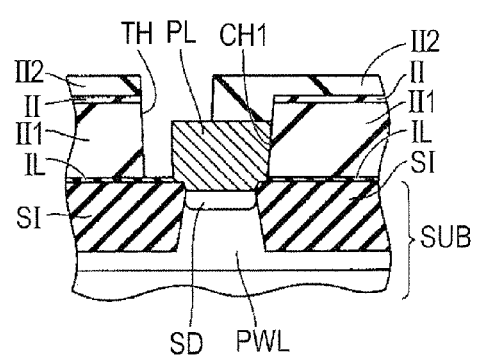

In a manufacturing method according to the present embodiment, similar steps to those in First Embodiment illustrated in FIGS. 9A to 19C are first performed. Subsequently, with reference to FIGS. 36A and 36B, the through-hole TH is formed in the region where the memory cell is formed by using a normal photoengraving technique and etching technique. This through-hole TH is formed so as to reach the liner film IL and so as to be coupled to the contact hole CH1 in the first interlayer insulating film IL1. Thereby, as in the First Embodiment, the through-hole TH is formed so as to expose both part of the upper surface of the plug conductive layer PL and part of the side surface thereof.

Figure 37A:
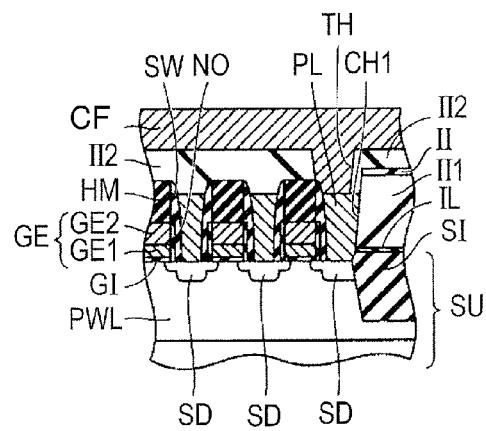
Figure 37B:
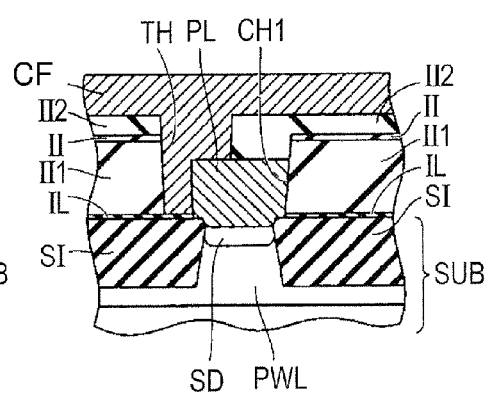

With reference to FIGS. 37A and 37B, the second conductive layer CF is formed over the second interlayer insulating film IL2 so as to occupy the inside of each of the through-hole TH and the contact hole CH1, and contact the liner IL at the bottom on the through hole TH side. This second conductive layer CF is formed from, for example, a barrier metal layer of Ti/TiN and a wiring layer of W.

Figure 38A:
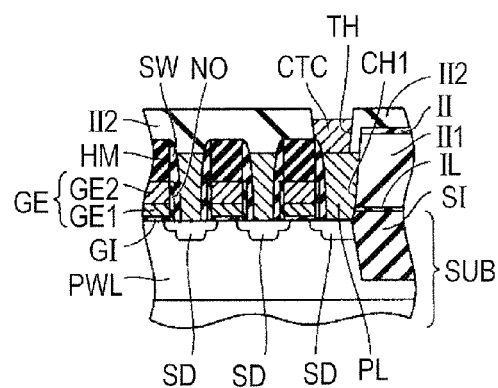
Figure 38B:
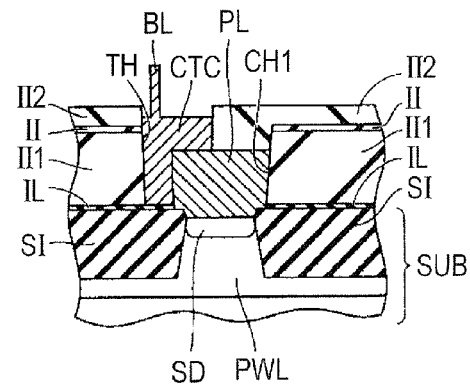

With reference to FIGS. 38A and 38B, the second conductive layer CF is patterned by using a usual photoengraving technique and etching technique. Thereby, from the second conductive layer CF, the contact conductive layer CTC and the wiring layers BL, /BL, and GND are formed to have unitary construction and integrally formed with each other in the region where the memory cell is formed; while the wiring layer ICL is formed in the region where the peripheral circuit is formed. Thus, the semiconductor device according to the present embodiment is manufactured.

Figure 35:
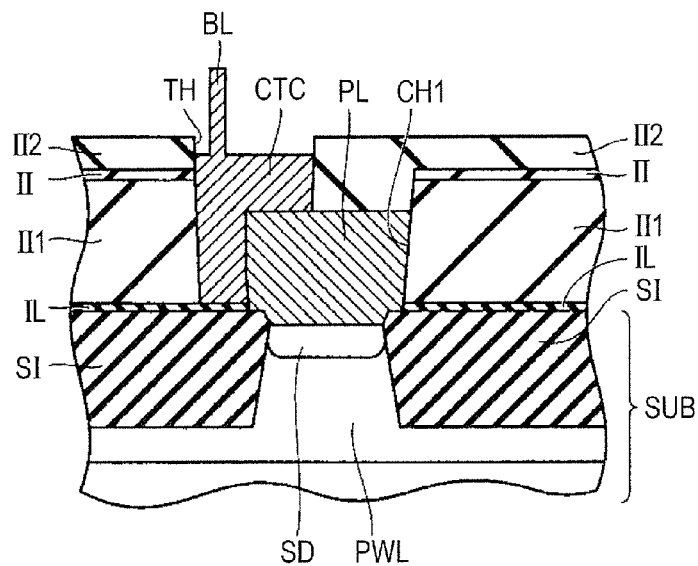
FIG. 35 is a schematic sectional view illustrating, by a section corresponding to Line VIII-VIII in FIG. 6, a structure of a semiconductor device according to Second Embodiment.

According to the present embodiment, the bottom of the contact conductive layer CTC reaches the liner film IL, as illustrated in FIG. 35. Accordingly, in present embodiment, the contact conductive layer CTC can be extended downward to a position deeper than that of the contact conductive layer CTC according to First Embodiment. Thereby, a further larger margin for the falling of the wiring layers BL, /BL, and GND can be secured.

(Third Embodiment)

In First Embodiment and Second Embodiment, the SRAM memory cell has been described; however, a structure in which the contact conductive layer CTC is coupled to both the upper surface and the side surface of the plug conductive layer PL, as in the present embodiment, may be applied to a DRAM.

Figure 39:
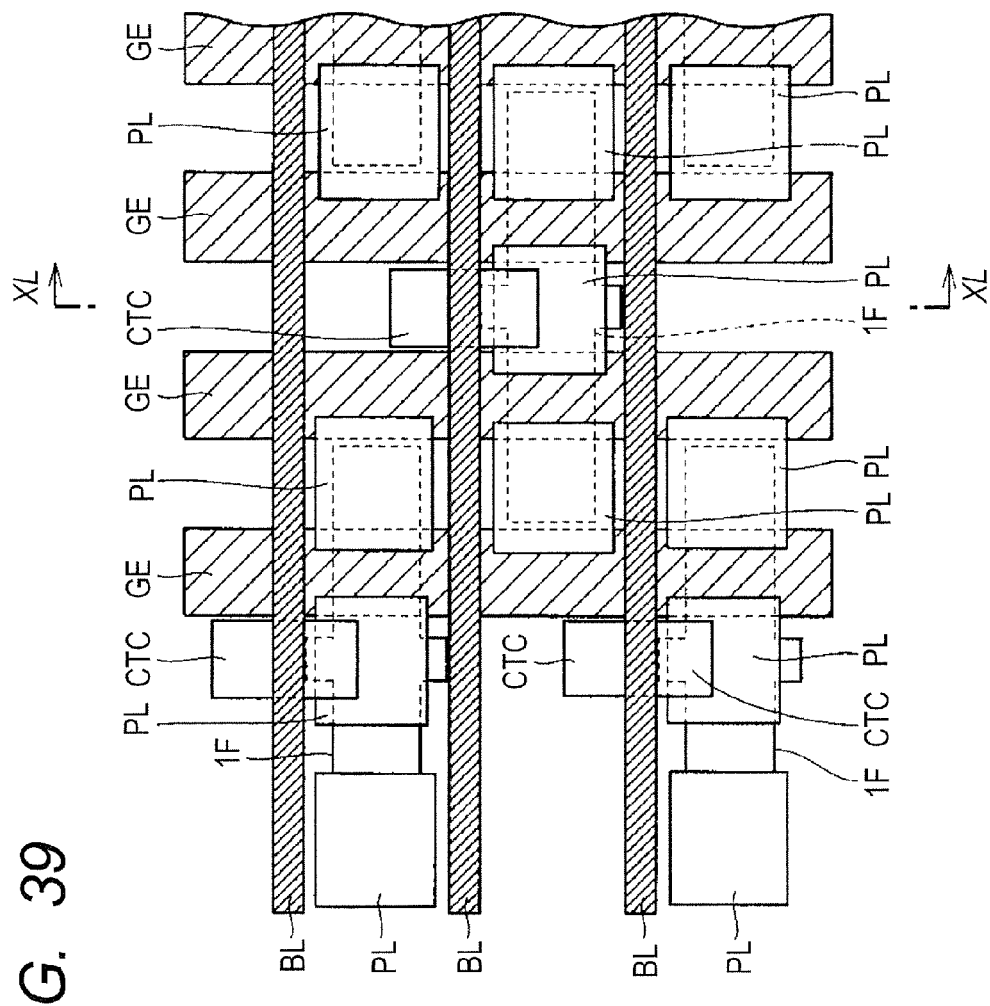
FIG. 39 is a plan view schematically illustrating a structure of a semiconductor device according to Third Embodiment.
Figure 40:
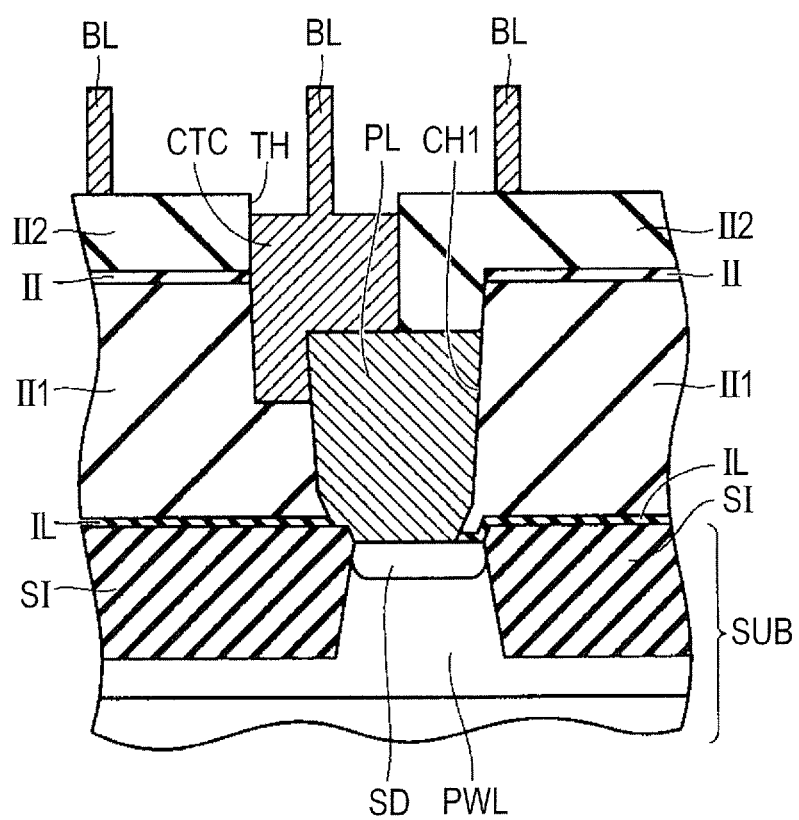
FIG. 40 is a schematic sectional view, taken along Line XL-XL in FIG. 39.

With reference to FIGS. 39 and 40, in the structure of a DRAM according to the present embodiment, the gate electrode GE and the bit-line BL are arranged so as to perpendicularly intersect with each other, when viewed from above, and a transistor is formed around the intersection between the gate electrode GE and the bit-line BL. This transistor has: a pair of source/drain regions SD formed in the active region 1F over the major surface of the semiconductor substrate SUB; and the gate electrode GE formed over the major surface of the semiconductor substrate SUB sandwiched by the pair of the source/drain regions SD, with a gate insulating layer being interposed between the transistor and the major surface. Two transistors are formed in one of the active regions 1F side by side, and one of the source/drain regions SD of one of the two transistors and one of the source/drain regions SD of the other transistor are formed by a common impurity region.

With reference to FIG. 40, the liner film IL, the first interlayer insulating film II1, and the insulating film II are laminated over the major surface of the semiconductor substrate SUB sequentially from down to up. The contact hole CH1, which penetrates these insulating films IL, II1, and II, is formed so as to reach the source/drain region SD. The plug conductive layer PL is formed in the contact hole CH1 so as to be coupled to the source/drain region SD. The upper surface of the plug conductive layer PL is located at a level lower than that of the upper surface of the first interlayer insulating film II1.

The second interlayer insulating film II2 is formed over the insulating film II and the plug conductive layer PL. The through-hole TH, by which part of the upper surface of the plug conductive layer PL and part of the side surface thereof are exposed, is formed in the second interlayer insulating film II2, the insulating film II, and the first interlayer insulating film II1. The contact conductive layer CTC is formed in the through-hole TH so as to be coupled to the upper surface and the side surface of the plug conductive layer PL.

With reference to FIG. 39, in the DRAM memory cell, the contact conductive layer CTC is formed so as to be coupled to the plug contact layer PL coupled to the source/drain region SD shard by the two transistors. Also, the contact conductive layer CTC is arranged so as to protrude in the channel width direction of the transistor (the vertical direction in the view) with respect to the plug conductive layer PL.

With reference to FIGS. 39 and 40, the bit-lines BL extend over the second interlayer insulating film II2 so as to be coupled to the contact conductive layer CTC. These bit-lines BL are formed integrally with each other by the same layer as the contact conductive layer CTC to which the bit-lines BL are coupled. Accordingly, the bit-lines BL are made of the same material as that of the contact conductive layer CTC. The bit-lines BL are arranged so as to run in parallel to each other at the same pitch.

It is preferable that the bit-line BL has, in a region not located directly over the plug conductive layer PL, a portion coupled to the contact conductive layer CTC. It is preferable that the bit-line BL is arranged in a region such that the entire length of the bit-line BL is not located directly over the plug conductive layer PL.

With reference to FIG. 39, a capacitor (not illustrated) is electrically coupled to the plug conductive layer PL to which the contact conductive layer CTC is not coupled.

Of the respective elements in the present embodiment, the elements corresponding to the respective elements in First Embodiment are denoted with like reference numerals. Of the respective elements in the present embodiment, in the elements corresponding to the respective elements in First Embodiment, the structure and material of each of them are approximately the same as those of each of the elements in First Embodiment, and hence the description thereof will not be repeated.

Subsequently, operations and effects of the present embodiment will be described in contrast with a related art illustrated in FIGS. 41 and 42.

Figure 41:
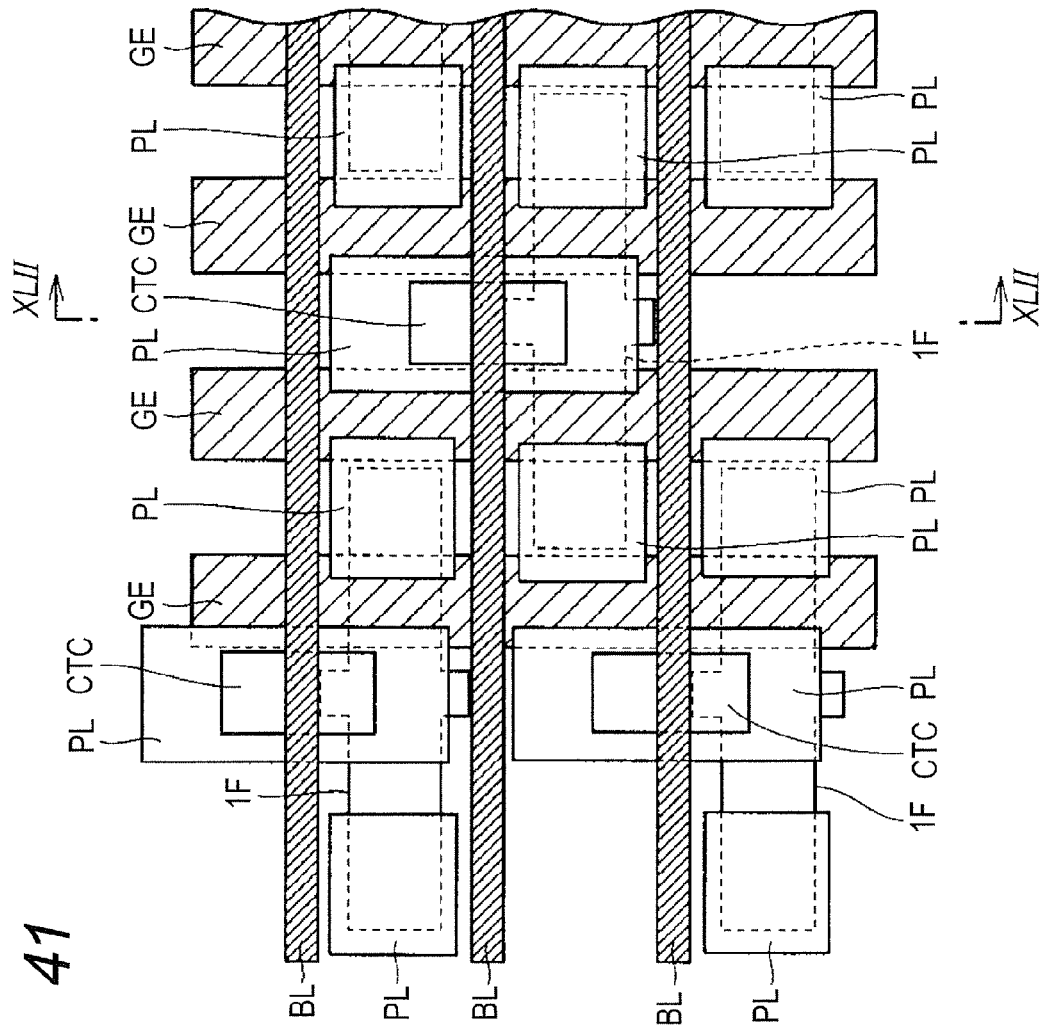
FIG. 41 is a plan view schematically illustrating a structure of a semiconductor device according to a related art.
Figure 42:
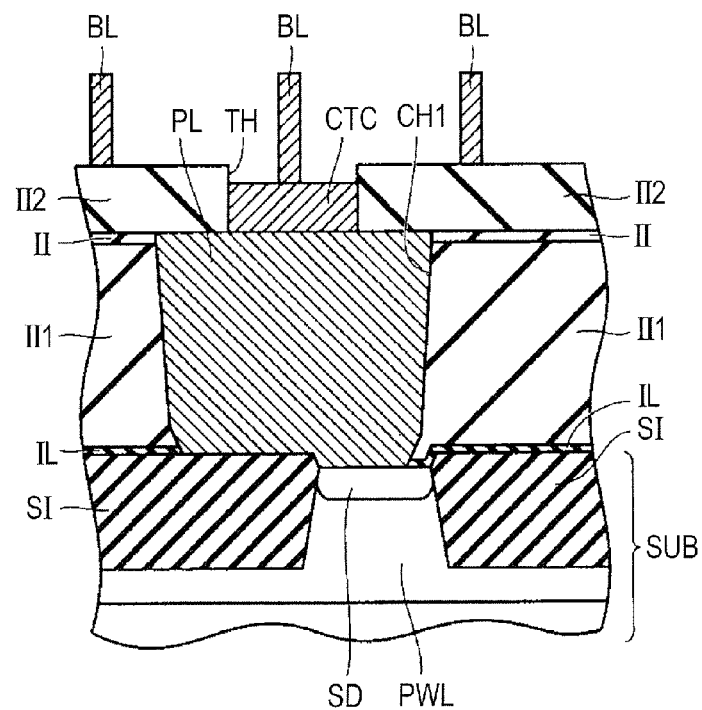
FIG. 42 is a schematic sectional view, taken along Line XLII-XLII in FIG. 41.

With reference to FIGS. 41 and 42, a structure according to the related art is different from that according to the present embodiment in that the contact conductive layer CTC is formed to contact only the upper surface of the plug conductive layer PL. Accordingly, in the structure according to the related art, the size of the upper surface of the plug conductive layer PL becomes large and the contact conductive layer CTC does not protrude from the position where the plug conductive layer PL is arranged, when viewed from above, as illustrated in FIG. 41. Also, as illustrated in FIG. 42, the upper surface of the plug conductive layer PL is located at the same level as that at which the upper surface of the first interlayer insulating film II1 is located. Also, the bit-line BL is located over a region located directly over the plug conductive layer PL to which the bit-line BL is electrically coupled.

Structures according to the related art, other than the aforementioned structure, are approximately the same as those according to the present embodiment, and hence like elements are denoted with like reference numerals and description thereof will not be repeated.

On the other hand, in the present embodiment, the contact conductive layer CTC is formed so as to contact both the upper surface and the side surface of the plug conductive layer PL, as illustrated in FIG. 40. Accordingly, it becomes easy to reliably couple the plug conductive layer PL and the contact conductive layer CTC to each other. Accordingly, the plug conductive layer PL and the contact conductive layer CTC can be reliably coupled to each other, even when the size of the upper surface of the plug conductive layer PL is made small with the miniaturization of the device.

Also, in the present embodiment, the contact conductive layer CTC is formed so as to contact both the upper surface and the side surface of the plug conductive layer PL, as illustrated in FIG. 40. Accordingly, a degree of freedom for arranging the bit-lines BL, which are formed integrally with the contact conductive layer CTC, is improved. Thereby, the bit-lines BL can be easily arranged at equal pitches, even when the device is miniaturized.

In the present embodiment, the contact conductive layer CTC is formed so as to contact both the upper surface and the side surface of the plug conductive layer PL, as illustrated in FIG. 40. Accordingly, the contact conductive layer CTC can be extended to a position deeper than that of the contact conductive layer CTC according to the related art. Thereby, a large margin for the falling of the bit-lines BL can be secured.

In the present embodiment, the bit lines BL are coupled to the contact conductive layer CTC in a region not located directly over the plug conductive layer PL, as illustrated in FIG. 40. Thereby, a degree of freedom for arranging the bit-lines BL, occurring when viewed from above, is improved.

In the present embodiment, the contact hole CH1 and the through-hole TH are formed so as to be coupled to each other in the first interlayer insulating film II1, as illustrated in FIG. 40. Thereby, the contact conductive layer CTC can be extended to a position deeper than that of the contact conductive layer CTC according to the related art, thereby allowing a large margin for the falling of the bit-lines BL to be secured.

In the present embodiment, the upper surface of the plug conductive layer PL is located at a level lower than that of the upper surface of the interlayer insulating film, as illustrated in FIG. 40. Thereby, thickness of the contact conductive layer CTC formed over the plug conductive layer PL must be increased. Accordingly, the falling of the bit-lines BL can be suppressed.

In the present embodiment, the contact conductive layer CTC is arranged so as to protrude in the channel width direction of the transistor TG with respect to the plug conductive layer PL, when viewed from above, as illustrated in FIG. 39. Accordingly, a degree of freedom for arranging, in the channel width direction, the bit-lines BL, which are to be coupled to the contact conductive layer CTC, is improved.

(Fourth Embodiment)

The structure common in the aforementioned First Embodiment to Third Embodiment will be described, with reference to FIG. 43, as a structure according to the present embodiment.

Figure 43:
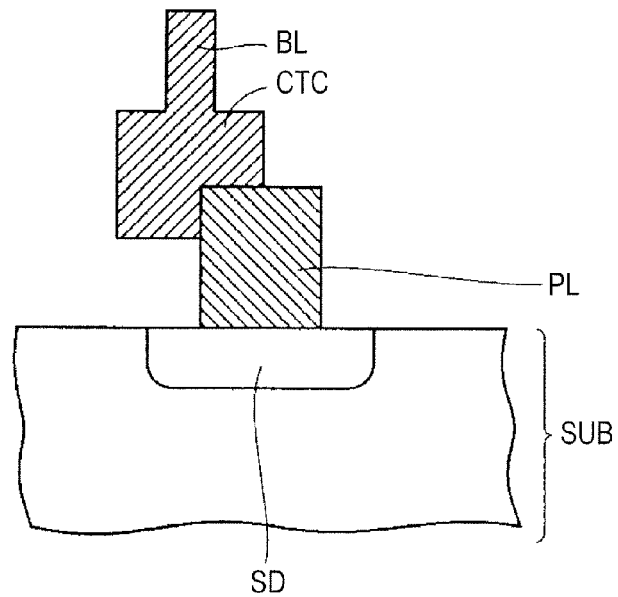
FIG. 43 is a sectional view schematically illustrating a structure of a semiconductor device according to Fourth Embodiment.

With reference to FIG. 43, in a semiconductor device according to the present embodiment, a conductive region SD, such as an impurity region, is formed over the major surface of the semiconductor substrate SUB. The plug conductive layer PL is located over the major surface of the semiconductor substrate SUB and coupled to the conductive region SD. The contact conductive layer CTC contacts both the upper surface and the side surface of the plug conductive layer PL. The wiring layer BL is formed on the contact conductive layer CTC so as to be electrically coupled to the contact conductive layer CTC.

In this structure, because the contact conductive layer CTC is formed so as to contact both the upper surface and the side surface of the plug conductive layer PL, it becomes easy to is reliably couple the plug conductive layer PL and the wiring layer BL located over the plug conductive layer PL to each other, and the falling of the wiring layer can be suppressed.

The invention made by the present inventors has been specifically described above based on the preferred embodiments; however, it is needless to say that the invention is not limited to the embodiments and various modifications may be made within a scope not departing from the gist of the invention.

What is claimed is:

1. A semiconductor device comprising:
a semiconductor substrate having a major surface;
a conductive region formed over the major surface;
a plug conductive layer occupying a first contact hole and located over the major surface and coupled to the conductive region, the plug conductive layer having an upper surface and a side surface;
a contact conductive layer contacting both the upper surface and the side surface of the plug conductive layer, and
a wiring layer electrically coupled to the contact conductive layer; wherein:
the plug conductive layer and the contact conductive layer differ from one another in composition;
in a cross-section of the semiconductor device, the contact conductive layer and the conductive region occupy different levels, with the conductive region closer to the substrate than the contact conductive layer;
in said cross-section, the contact conductive layer is spaced apart from both the substrate and the conductive region,
the plug conductive layer occupying the first contact hole electrically connects the contact conductive layer to the conductive region; and
the wiring layer protrudes from the contact conductive layer in a direction away from the semiconductor substrate, the wiring layer being over the contact conductive layer and having a width less than a width of the contact conductive layer.

2. The semiconductor device according to claim 1, wherein, in said cross-section, no portion of the wiring layer is coupled to the contact conductive layer in a region located directly over the plug conductive layer.

3. The semiconductor device according to claim 1, wherein the contact conductive layer and the wiring layer have the same composition and are formed integrally with one another to have unitary construction.

4. The semiconductor device according to claim 1 further comprising an interlayer insulating film formed over the major surface of the semiconductor substrate,
wherein the plug conductive layer occupies a first hole formed in the interlayer insulating film,
wherein the contact conductive layer occupies a second hole formed in the interlayer insulating film, and
wherein the second hole overlaps the first hole such that the plug conductive layer and the contact conductive layer are electrically coupled to each other.

5. The semiconductor device according to claim 4, wherein the bottom of the second hole is comprised of the interlayer insulating film.

6. The semiconductor device according to claim 4 further comprising a liner layer formed between the major surface of the semiconductor substrate and the interlayer insulating film,
wherein the bottom of the second hole is comprised of the liner layer.

7. The semiconductor device according to claim 4, wherein the upper surface of the plug conductive layer is located at a level lower than that at which an upper surface of the interlayer insulating film is located.

8. The semiconductor device according to claim 1, wherein the conductive region is one of a source region and a drain region of a transistor, and
wherein the contact conductive layer is arranged so as to protrude in a channel width direction of the transistor with respect to the plug conductive layer, when viewed from a direction perpendicular to the major surface.

9. The semiconductor device according to claim 1, wherein the conductive region is one of a source region and a drain region of a transistor included in a memory cell, and
wherein the wiring layer intersects and linearly extends through a region where the memory cell is formed, when viewed from a direction perpendicular to the major surface.

10. The semiconductor device according to claim 1, wherein the conductive region is one of a source region and a drain region of a transistor included in a memory cell in an SRAM.

11. The semiconductor device according to claim 1, wherein the conductive region is one of a source region and a drain region of a transistor included in a memory cell in a DRAM.

12. The semiconductor device according to claim 1, wherein:
a first interlayer insulating film is formed over the conductive region;
a second interlayer insulating film is formed over the first interlayer insulating film;
the plug conductive layer occupies a first hole formed in the first interlayer insulating film, with the upper surface of the plug being located at a level lower than that of an upper surface of the first interlayer insulating film;
the contact conductive layer occupies a second hole formed in both the first interlayer insulating film and the second interlayer insulating film.

13. The semiconductor device according to claim 12, wherein:
the second hole overlaps the first hole such that an interface between the contact conductive layer and the plug conductive layer extends in three dimensions relative to the semiconductor substrate.

14. The semiconductor device according to claim 1, wherein the wiring layer is arranged such that an entire length of the wiring layer is not located directly over the plug conductive layer.

15. A semiconductor device comprising:
a semiconductor substrate having a major surface;
a conductive region formed over the major surface;
a first interlayer insulating film formed over the conductive region;
a second interlayer insulating film formed over the first interlayer insulating film;
a plug conductive layer located over the major surface and coupled to the conductive region, the plug conductive layer occupying a first contact hole formed in the first interlayer insulating film, an upper surface of the plug conductive layer being located at a level lower than that of an upper surface of the first interlayer insulating film;
a contact conductive layer contacting the plug conductive layer, the contact conductive layer occupying a second hole formed in both the first interlayer insulating film and the second interlayer insulating film; and
a wiring layer electrically coupled to the contact conductive layer, the wiring layer being over the contact conductive layer and having a width less than a width of the contact conductive layer;
wherein:
the second hole overlaps the first contact hole such that the contact conductive layer occupying the second hole contacts a shoulder portion of the plug conductive layer, thereby forming an interface that extends in three dimensions relative to the semiconductor substrate;
the plug conductive layer and the contact conductive layer differ from one another in composition;
in a cross-section of the semiconductor device, the contact conductive layer and the conductive region occupy different levels, with the conductive region closer to the substrate than the contact conductive layer;
in said cross-section, the contact conductive layer is spaced apart from both the substrate and the conductive region; and
the plug conductive layer occupying the first contact hole formed in the first interlayer insulating film electrically connects the contact conductive layer to the conductive region.

16. The semiconductor device according to claim 15, wherein the contact conductive layer and the wiring layer have the same composition are formed integrally with one another to have unitary construction.

17. The semiconductor device according to claim 16, wherein, in said cross-section, no portion of the wiring layer is coupled to the contact conductive layer in a region located directly over the plug conductive layer.

18. The semiconductor device according to claim 17, wherein the wiring layer is arranged such that an entire length of the wiring layer is not located directly over the plug conductive layer.

* * * * *